United States Patent [19]

Yamamoto et al.

[11] Patent Number: 4,783,368
[45] Date of Patent: Nov. 8, 1988

[54] HIGH HEAT CONDUCTIVE INSULATED SUBSTRATE AND METHOD OF MANUFACTURING THE SAME

[75] Inventors: Kenji Yamamoto; Takehisa Nakayama; Yoshihisa Tawada, all of Kobe, Japan

[73] Assignee: Kanegafuchi Kagaku Kogyo Kabushiki Kaisha, Osaka, Japan

[21] Appl. No.: 927,211

[22] Filed: Nov. 5, 1986

[30] Foreign Application Priority Data

| Nov. 6, 1985 | [JP] | Japan | 60-249534 |
| Dec. 26, 1985 | [JP] | Japan | 60-295434 |
| Jan. 22, 1986 | [JP] | Japan | 61-11647 |
| Mar. 31, 1986 | [JP] | Japan | 61-75310 |
| Apr. 7, 1986 | [JP] | Japan | 61-79875 |

[51] Int. Cl.⁴ ............................ B32B 9/04; B32B 7/00
[52] U.S. Cl. ..................................... 428/408; 428/446; 428/450; 428/457; 428/698; 428/336
[58] Field of Search ............... 428/408, 411.1, 446, 428/457, 688, 689, 698, 699; 148/DIG. 1, DIG. 13, DIG. 58, DIG. 113, DIG. 114, DIG. 148

[56] References Cited

U.S. PATENT DOCUMENTS

| 4,412,903 | 11/1983 | Green et al. | 428/408 X |
| 4,486,286 | 12/1984 | Lewin et al. | 428/408 |
| 4,524,106 | 6/1985 | Flasck | 428/408 |
| 4,597,844 | 7/1986 | Hiraki et al. | 428/408 X |

FOREIGN PATENT DOCUMENTS

| 58-91100 | 5/1983 | Japan . |
| 60-27188 | 6/1985 | Japan . |

*Primary Examiner*—John E. Kittle
*Assistant Examiner*—Susan S. Rucker
*Attorney, Agent, or Firm*—Armstrong, Nikaido, Marmelstein & Kubovcik

[57] ABSTRACT

An insulated substrate having high thermal conductivity comprising a substrate having a thermal conductivity of not less than 50 W/m.k., and an insulating layer having high thermal conductivity coated on the substrate; and a method of producing the insulated substrate characterized in that an insulating layer is formed on a substrate by applying DC voltage and RF power to the substrate and providing a magnetic field parallel to the surface of the substrate.

The insulated substrate has good heat conductivity, thermal resistance and smooth surface, whereby exfoliation can be prevented.

61 Claims, 8 Drawing Sheets

HIGH HEAT CONDUCTIVE INSULATED SUBSTRATE AND METHOD OF MANUFACTURING THE SAME

BACKGROUND OF THE INVENTION

The present invention relates to an insulated substrate having high thermal conductivity and a method of manufacturing the same.

The packaging density of semiconductor devices has become high with the reduction in size, increase in degree of integration and increase in output of electronic circuits due to the development in IC (Integrated Circuit), LSI (Large Scale Integration), and the like. As the degree of integration, output and density of semiconductor devices become high or large, the number of devices per one chip becomes large year by year, whereby the calorific value per one chip increases. There is strongly desired a material for a package having high thermal conductivity, because the increase of calorific value has a significant influence upon the reliability of semiconductor devices. Further, in the case of hybrid IC, heat-generating parts are disposed in the same package, so there is required an insulating substrate having high thermal conductivity in order to make the packaging density still higher. Still further, in consideration of the actual mounting of devices on the substrate, the substrate preferably should have a coefficient of thermal expansion similar to those of the devices, other material constituting the package and circuit substrates, and should allow chips to be bonded directly on the substrates.

As a substrate which satisfies the above requirements, there has been proposed a ceramic substrate made of $Al+Al_2O_3$, crystalline SiC, BeO, AlN and the like; or an enamel substrate obtained by covering a metal substrate with ceramic. But the above substrates are all expensive except for the enamel substrate. The substrate made of BeO is toxic. The substrate made of crystalline SiC has a problem in that its dielectric constant at high frequency is large, i.e. it is above 40 at 1 MH, because BeO is used as an auxiliary for sintering in cystalline SiC. Further, the substrate made of $Al+Al_2O_3$ has problems in that the thermal conductivity and heat resistance are insufficient, because the coefficient of linear expansion of the substrate is large and the insulating property of $Al_2O_3$ is insufficient, thereby epoxy coating is required to compensate for these drawbacks. In the case of a cheap enamel substrate, it has problems in that its coefficient of linear expansion is large and thermal conductivity is poor. AlN has poor stability to water or alkali.

Recently, there have been produced carbon films having high hardness comprising diamond, diamond-like carbon, i-carbon and the like by means of an ion beam vacuum evaporation method, ion beam sputtering method, CVD method, plasma CVD method, and the like. The films have been taken notice of as hard insulating materials.

The term "diamond-like carbon" means a film wherein (1) diamond and amorphous carbon, (2) diamond and graphite, or (3) diamond, graphite and amorphous carbon are mixed.

In producing carbon films having high hardness by means of the plasma CVD method, and the like, carbon films having high hardness as deposited on a substrate by plasma decomposing a mixed gas of a hydrocarbon compound and $H_2$, or an inert gas such as Ar or He.

The carbon film obtained by the above manner has large internal stress and selectivity to the substrate. That is, it has good adhesive property to a substrate comprising crystalline silicon, diamond, W, Mo, CuW and the like. However, it has large internal stress and small adhesive strength to a substrate comprising widely-used SUS (stainless steel), Al, Al alloy, Cu, Cu alloy, Ni, Zn, Zn alloy, whereby exfoliation takes place to shorten the life of the film. That is, in general, the carbon film is easy to exfoliate in the case of a substrate made of Al, Cu, Cu alloy, stainless steel, and the like having a large coefficient of thermal expansion. On the other hand, it is hard to exfoliate in the case of a substrate made of crystalline silicon, W, Mo, CuW and the like which have a coefficient of thermal expansion approximate to that of diamond.

Diamond has bee utilized as a material for a heat sink used in semiconductor devices for large power, microwave oscillating devices as VLSI, because diamond has high thermal conductivity and good electrical insulating property.

However, in producing a diamond-made thin film in practice, there are generally deposited amorphous carbon and graphite besides diamond when forming the film by means of vapor deposition, whereby the growth of diamond is disturbed. Further, the thus obtained thin film has a polycrystalline structure, and a graphite layer is formed at an intergranular portion thereof. Therefore, the diamond thin film produced in the above manner is very poor in electrical insulating property, particularly in dielectric breakdown.

The problems associated with a conventional thin film made of diamond and/or diamond-like carbon produced by several kinds of vapor phase growth methods are explained below.

(1) In the case of a heat filament CVD method, a tungsten heater for heating a substrate is heated up to about 2000° C., accordingly a large amount of tungsten is vaporized, causing a problem in that the tungsten heater is exhausted in a short time and is easily cut. Further, there are generated graphite-like portions because of the nonuniformity in temperature caused by the change with the passage of time in the tungsten heater. Therefore, there is a problem in that it is difficult to form a film composed solely of diamond in producing a thin film having a large area.

(2) In the case of an ion beam sputtering method or ion plating method, the obtained thin film has problems in that the electrical resistivity of the film is lowered, causing its insulating property to become insufficient, because the above-mentioned amorphous carbon or graphite, except diamond, deposits in the thin film.

(3) In the case of a microwave CVD method, it is necessary, as described below, to add $H_2$ to the reaction gas in order to generate hydrogen radicals to remove amorphous carbon or graphite generated in the thin film. That is, it is necessary to dilute $CH_4$, which is a raw material gas, with $H_2$ to lower the concentration of $CH_4$ to not more than 1%, whereby the velocity of forming a thin film is limited. Further, in increasing the area of the film formed on the substrate, there is caused a problem in that graphite is formed due to nonuniformity of the concentration of hydrogen radicals.

When producing thin films made of diamond and/or diamond-like carbon in such manners as described above, it is necessary to etch amorphous carbon or graphite formed in the thin film with hydrogen radicals, and the like.

However, in practice, the concentration of hydrogen radicals, and the like is apt to become nonuniform throughout the surface of the substrate when, for instance, a thin film made of diamond and/or diamond-like carbon is formed on a silicon substrate. Therefore, amorphous carbon or graphite is locally formed and reduces the electrical insulating property. Every film obtained by the above methods has a polycrystalline structure. It is impossible to use substrates coated with these films as insulated substrates having high thermal conductivity, because the formation of graphite at intergranular portions is unavoidable and, therefore, sufficient electrical insulating property cannot be obtained. Further, at present, it is impossible to use the above films an electric insulating films, in case of producing films having a large area.

Further, there have been employed flame-coated substrates as metal base substrates, but these substrates have poor surface smoothness. It is impossible to form diamond, diamond-like carbon or SiC each having high thermal conductivity on a metal substrate by means of a flame coating technique at present.

It has been reported that diamond or diamond-like carbon could be formed on a crystalline silicon substrate, Mo substrate, W substrate or diamond substrate by means of an ion beam method, plasma CVD method, thermal CVD method, electron beam CVD method, and the like. But there has not yet been reported that diamond or diamond-like carbon could be formed at Al substrate, Al-Si substrate, Cu substrate, and Cu alloy substrate having high thermal conductivity, where are used widely and are cheap.

The present invention was made to solve the above problems and an object thereof is to provide an insulated substrate having high thermal conductivity and a method of manufacturing the same. That is, an object of the present invention is to provide an insulated substrate which does not have the drawbacks of the conventional substrates such as AlN, crystalline SiC and BeO, i.e. the substrate of the present invention has a coefficient of linear expansion closely akin to that of the material constituting packages such as devices, or circuit substrates; good thermal conductivity and heat resistance; smooth surface; and is able to produce circuits having thick films.

Another object of the present invention is to solve the above problem of exfoliation, to increase the adhesive strength, to reduce the internal stress and to increase the deposition velocity of heard carbon films.

A further object of the present invention is to provide an insulated substrate having high thermal conductivity comprising multilayer films, which has superior insulating property and high thermal conductivity.

SUMMARY OF THE INVENTION

In accordance with the present invention, there is provided an insulated substrate having high thermal conductivity comprising a substrate having a heat conductivity not less than 50 W/m.k, and an insulating layer having high thermal conductivity coated on the substrate, and a method of producing an insulating substrate having high thermal conductivity characterized in that an insulating layer is formed on a substrate by applying DC voltage and RF power to the substrate and providing a magnetic field parallel to the surface of the substrate.

DETAILED DESCRIPTION

Figure 1:
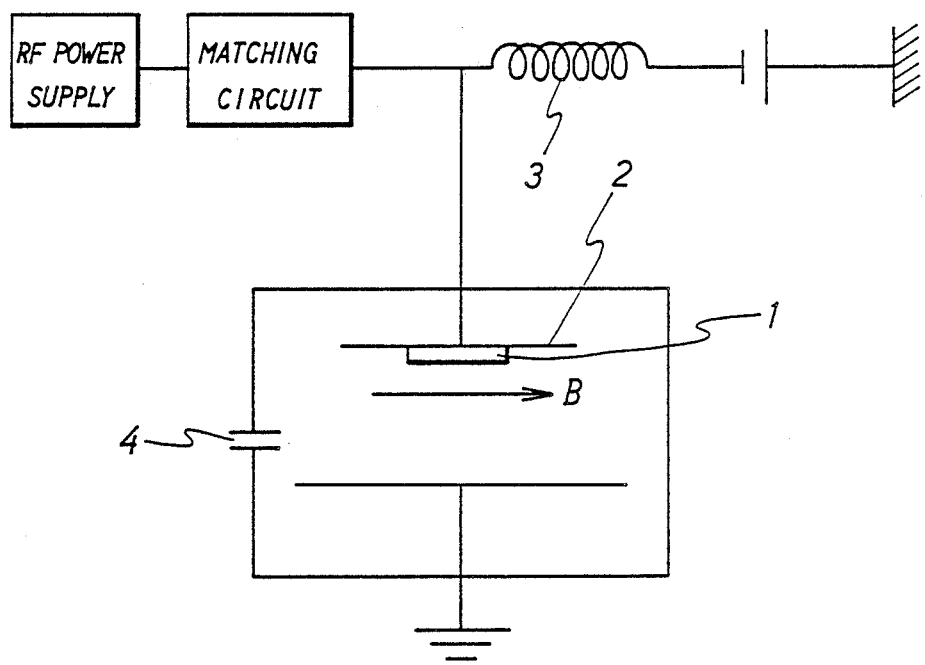
FIG. 1 is a view explaining a plasma CVD apparatus used in producing an insulated substrate of the present invention.

An insulated substrate of the present invention, in case crystalline silicon is used as a substrate, is hereinafter explained. In the present invention, the term "silicon substrate" means a substrate comprising single crystalline silicon or polycrystalline silicon having thermal conductivity of not less than 50 W/m.k, and having a shape, for instance, of 10 to 200 mm$\phi$ or 10 to 200 mm and a thickness of 0.1 to 2 mm.

In the present invention, at least a part of the surface of the above substrate is coated with an insulated layer having high thermal conductivity.

The expression "at least a part of the surface of the substrate is coated" means that at least a desired part is coated. Therefore, the ratio of the coated part to the whole surface of the substrate is not limited, i.e. the whole surface of the substrate might be coated, or only a small part thereof might be coated.

Examples of a material to form an insulating layer having high thermal conductivity of not less than 50 W/m.k, preferably not less than 100 W/m.k include, for instance, diamond, diamond-like carbon, silicon carbide, amorphous silicon carbide, c-BN, h-BN and AlN. Using at least one of these materials, there is formed an insulating layer having preferably a thickness of 1 to 50 μm, more preferably a thickness of 2 to 20 μm. In the case an insulating layer is formed using not less than two kinds of materials, the insulating layer might have a complex structure.

In case diamond-like carbon is used to form an insulating layer, it is preferable that the diamond-like carbon contains not more than 9 atm% of at least one of silicon and Ge atom, since the obtained layer has physical properties close to diamond, i.e. has a small internal stress and large adhesive strength. The more preferable content range is 0.1 to 4 atm%. When the amount of silicon or Ge in the film is more than 9 atm%, the heat conductivity is lowered.

Though the details with respect to the above effects caused by a very small amount of Si or Ge are not clear at present, it is considered that the $sp^3$ orbit of Si or Ge functions effectively in the nucleation of diamond.

In case amorphous silicon carbide is used to form an insulating layer, the amorphous silicon carbide preferably contains not more than 30 atm %, more preferably 0.1 to 10 atm %, of at least one of hydrogen atom and elements of the halogen group, to obtain high heat conductivity.

The above insulating layer is preferably used in an insulated substrate, because the insulating layer has usually an electrical resistivity of not less than $10^8$ Ω·cm and thermal resistance of not less than 20 V/μm.

Next, there is explained a method of producing an insulated substrate of the present invention using the above-mentioned crystalline silicon substrate.

The method of forming an insulating layer on a single crystalline or polycrystalline silicon substrate is not particularly limited in the present invention, that is, any method can be employed as long as the insulating layer comprising the above materials is formed.

Concrete examples of the above method include, for instance, DC discharge plasma CVD method, RF discharge plasma CVD method, mixed plasma CVD method of DC discharge and RF discharge having a magnetic field falling at right angles with the electric field. These methods are employable in forming insulating layers comprising diamond, diamond-like carbon, silicon carbide, amorphous silicon carbide, cubic BN, hexagonal BN, and the like. It is preferable to employ a mixed plasma CVD method of DC discharge and RF discharge having a magnetic field falling at right angles with the electric field in forming an insulating layer comprising diamond, diamond-like carbon, silicon carbide or amorphous silicon carbide, because there can be produced a film having good crystallization and heating conductivity.

When producing insulated substrates having high thermal conductivity by means of the mixed plasma CVD method of DC discharge and RF discharge having a magnetic field falling at right angles with the electric field, there can be used, for example, an apparatus as shown in FIG. 1. That is, a substrate 1 comprising single crystalline silicon or polycrystalline silicon is set in the apparatus on the side of a RF closing electrode 2. DC voltage of, preferably −150 to −600 V is applied to the substrate through a ratio frequency choking coil 3, and RF power of, preferably 100 to 400 W (140 to 560 mW/cm²) is applied to substrate. Pressure in the reaction chamber and substrate temperature are preferably 0.1 to 20 Torr and 200° to 350° C., respectively. Magnetic field B of, preferably, 100 to 1000 gauss is provided parallel to the surface of the substrate. Numeral 4 is a gas inlet.

The substrate of the present invention produced in such a manner as described above has a thermal conductivity of not less than 50 W/m.k, preferably not less than 100 W/m.k.; surface Vickers hardness of not less than 500, preferably not less than 1500 and more preferably not less than 2000; electrical resistivity of not less than $1 \times 10^9$ Ω·cm, which varies depending on the kind of insulating layer; dielectric constant at 1 MHz of not more than 20 (in case of silicon carbide, dielectric constant of not more than 15); and dielectric loss at 1 MHz of not more than 0.02.

Further, the insulated substrate is suitable as material for a hybrid IC substrate for a thick film circuit which requires high temperature treatment, since a single crystalline silicon or polycrystalline silicon substrate is used as a substrate to form an insulating layer thereon. The insulated substrate is very stable to acid and alkali.

The insulated substrate of the present invention, wherein an insulating layer having high thermal conductivity is formed on a single crystalline or polycrystalline silicon substrate, is employable as a hybrid IC substrate or a substrate for radio frequency high power transistor, because the insulated substrate of the present invention has high thermal conductivity and low dielectric constant.

Next, there is described an insulated substrate wherein a substrate comprises nitrated or oxidized crystalline silicon. The employable substrates are the same as the crystalline silicon substrates described above.

Crystalline silicon used for substrates might be metallic, or doped into p-type or n-type. In case of forming through holes on the substrate, it is preferable that they are formed before the substrate is nitrated or oxidized from the viewpoint of improving the insulating property of the through hole portion.

In the present invention, at least a part of the surface of a nitrated or oxidized substrate is coated with an insulating layer having high thermal conductivity.

The nitration or oxidation of crystalline silicon substrate is carried out in order to obtain uniform and fine insulation, and strong adhesive strength to the insulating layer coated on the substrate after nitration or oxidation. The depth of nitration or oxidation from the surface of a substrate is preferably at least 0.1 μm, more preferably 0.5 μm. On the other hand, from the viewpoint of preventing the strain of internal stress in a nitrated or oxidized layer, or cracks caused by the strain, the thickness of the nitrated or oxidized layer is preferably not more than 5 μm.

In case of nitrating or oxidizing crystalline silicon substrate, there can be employed a conventional DC discharge method, for example RF discharge method using radio frequency of about 100 KHz to 50 MHz, or microwave plasma discharge method. In particular, it is preferably to treat a crystalline silicon substrate with plasma while biasing minus voltage to the substrate, because high reactivity and strong adhesive strength can be obtained.

The expression "at least a part of the surface of the substrate is coated" means that at least a desired part is coated. Therefore, the ratio of the coated part to the whole surface of the substrate is not limited; i.e. the whole surface might be coated, or only a small part thereof might be coated.

A preferable example of a material to form an insulating layer having high thermal conductivity of not less than 50 W/m.k, preferably not less than 100 W/m.k, is one that contains at least one of silicon, germanium and carbon as a main component, i.e. not less than 30 atm %. The material might contain 0.1 to 30 atm % of hydrogen or elements of the halogen group.

Concrete examples of the above insulating material include, for instance, hard carbon material such as diamond, diamond-like carbon, silicon carbide and germanium carbide (which are disclosed in the specifications of Japanese Patent Applications No. 83137/1985, No. 179025/1985 and No. 209620/1985, and the like); silicon-containing non single crystalline material such as silicon carbide, silicon nitride, silicon germanium, silicon germanium carbide, silicon carbide nitride, silicon oxide, silicon nitride oxide, silicon carbide oxide (which are disclosed in Japanese Unexamined Patent Publications No. 82669/1985 and No. 119784/1985, and in the specification of Japanese Patent Application No. 187036/1984, and the like); c-BN; h-BN; AlN; and BP. Using at least one of these materials, there is formed an insulating layer having preferably a thickness of 0.5 to 10 μm, more preferably a thickness of 1 to 10 μm. In case an insulating layer is formed using not less than two kinds of materials, the insulating layer might have a complex structure.

In case diamond-like carbon is used to form an insulating layer, it is preferable that the diamond-like carbon contains not more than 9 atm % of at least one of silicon and Ge atoms, since the obtained layer has physical properties close to diamond, i.e. has small internal stress and large adhesive strength. The more preferable content range is 0.1 to 4 atm %. When the amount of silicon or Ge in the film is more than 9 atm %, the heat conductivity is lowered.

Through the details with respect to the above effects caused by a very small amount of Si or Ge are not clear at present, it is considered that the $sp^3$ orbit of Si or Fe functions effectively in the nucleation of diamond.

In case amorphous silicon carbide is used to form an insulating layer, the amorphous silicon carbide preferably contains not more than 30 atm %, more preferably 0.1 to 10 atm %, of at least one of hydrogen atom and elements of the halogen group, to obtain high heat conductivity.

Among these insulating layers, a layer having electric conductivity of not more than $10^{-6}$ $(\Omega \cdot cm)^{-1}$, preferably not more than $10^{-8}$ $(\Omega \cdot cm)^{-1}$, more preferably not more than $10^{-9}$ $(\Omega \cdot cm)^{-1}$, and able to withstand voltage of not less than 100 V/um is suitable for insulated substrate use.

Next, there is explained a method of producing the insulated substrate having high thermal conductivity of the present invention, wherein a nitrated or oxidized crystalline silicon substrate is used.

The method of forming an insulating layer on the surface of a nitrated or oxidized crystalline silicon substrate is not particularly limited. Any method is employable as long as an insulating layer comprising the above-mentioned material can be formed. For example, such a method as described in the above Patent Publication or specifications is preferably employable.

Concrete examples of the above method include, for instance, DC discharge plasma CVD method, RF discharge plasma CVD method, mixed plasma CVD method of DC discharge and RF discharge and mixed plasma CVD method of DC discharge and RF discharge having a magnetic field falling at right angles with the electric field. These methods are employable in forming insulating layers comprising diamond, diamond-like carbon, silicon carbide, amorphous silicon carbide, cubic BN, hexagonal BN, and the like. It is preferable to employ a mixed plasma CVD method of DC discharge and RF discharge having a magnetic field falling at right angles with the electric field in forming an insulating layer comprising diamond, diamond-like carbon, silicon carbide or amorphous silicon carbide, because there can be produced a film having good crystallization and heat conductivity.

When producing insulated substrates having high thermal conductivity by means of a mixed plamsa CVD method of DC discharge and RF discharge having a magnetic field falling at right angles with the electric field, there can be used, for example, an apparatus as shown in FIG. 1. That is, a substrate 1 comprising single crystalline silicon or polycrystalline silicon is set in the apparatus on the side of a RF closing electrode 2. DC voltage of, preferably, $-150$ to $-600$ V is applied to the substrate through a radio frequency chocking coil 3, and RF power of, preferably 100 to 400 W (140 to 560 mW/cm$^2$) is applied to the substrate. The pressure in the reaction chamber and substrate temperature are preferably 0.1 to 20 Torr and 200° to 350° C., respectively. Magnetic field B of, preferably 100 to 1000 gausses, is provided parallel to the surface of the substrate.

There can be employed an ion plating method, cluster beam method, thermal CVD method, ion vacuum evaporation method, and the like besides the above-mentioned method.

The substrate of the present invention produced in such a manner as described above has a thermal conductivity of about 120 W/m.k. which is almost equal to that of single crystalline silicon; surface Vickers hardness of not less than 500, preferably not less than 1500 and more preferably not less than 2000; electric conductivity of not more than $1 \times 10^{-6}$ $(\Omega \cdot cm)^{-1}$, preferably not more than $1 \times 10^{-8}$ $(\Omega \cdot cm)^{-1}$, which varies depending on the kind of insulating layer; dielectric constant at 1 MHz of not more than 20 (in case of silicon carbide, dielectric constant of not more than 15); and dielectric loss at 1 MHz of not more than 0.02.

Further, the coefficient of thermal expansion of the insulated substrate is almost equal to that of LSI or IC chips since crystalline silicon substrates are used in the present invention. Therefore, the insulated substrate is suitably used as a material for a multilayer substrate, or IC substrate such as hybrid IC substrate for a thick film circuit requiring high temperature treatment, since chips can be directly bonded on the substrate and the substrate can stand heating to 800° C. Further, the insulated substrate of the present invention is easily electroplated, vacuum evaporated, or sputtered by Cu or the like to obtain a substrate for wiring use. The substrate is still further very stable to acid and alkali, and has good adhesive strength to the insulating layer and high reliability of through holes.

The insulated substrate of the present invention, wherein an insulating layer having high thermal conductivity is deposited on a nitrated or oxidized crystalline silicon substrate, has very high electrical resistivity. The thermal conductivity thereof is almost equal to that of Si. Furthermore, the undesirable exfoliation of an insulating layer does not take place even when the substrate is repeatedly heated. Si chips such as LSI and IC can be directly bonded on the substrate, since the coefficient of linear expansion of the substrate is equal to that of Si chips.

Next, there is described an insulated substrate wherein an insulating layer comprises a hard carbon film containing 0.01 to 20 atm % of elements of group IVA. The film is deposited by a method using plasma or ions.

As a method of forming a film using plasma or ions, there can be employed, for instance, an ion beam vacuum evaporation method, ion beam sputtering method, sputtering CVD method, plasma CVD method, and the like. However, the method employable in the present invention is not limited to those methods described above. Among these methods, the plasma CVD method is preferable, because the apparatus used therefor is simple and a film having a large area can be obtained. In particular, it is preferable to form a hard carbon film by means of a DC plasma CVD method, RF plasma CVD method, mixed plasma CVD method of RF and DC, or mixed plasma CVD method of RF and DC in which a magnetic field falling at right angles with the electric field is provided on the substrate, while mixing a gas of a compound containing elements of group IVA into a gas of a compound containing carbon. These methods can be employed not only solely but also in joint use.

Preferable examples of a metal substrate employable in the present invention include, for instance, stainless steel; Cu; alloy of Cu and Al, Zn, Cd, Ge, Ti, Ag, Si and the like; Al; alloy of Al and Mn, Mg, Mg-Si, Ci, Cu, Mg and the like; Ni; Zn; alloy of Zn and Pb, Fe, Cd, Sn, Al; W; Mo; and WC. Among these examples, substrates made of widely-used stainless steel, Cu, Cu alloy, Al, Al alloy, Ni, Zn, Zn alloy are preferable, because they are economical, easy to get, easy to work and moreover a substrate having large area can be produced with ease.

Hard carbon films in the present invention contain elements of the IV group. Examples of elements of group IVA include, for instance, Si, Ge, Sn. Not less than two of these elements can be contained in the hard carbon film. These elements serve to reduce internal stress in the film and to improve the adhesive property to metal substances.

The hard carbon film in the present invention contains 0.01 to 20 atm %, preferably 0.01 to 15 atm %, more preferably 0.01 to 10 atm %, still more preferably 0.1 to 5 atm % and most preferably 1 to 3 atm % of elements of the IVA group.

When one kind of element of the IVA group is contained in the film, the preferable range of content is 0.01 to 20 atm % in the case of Si, 0.01 to 15 atm % in the case of Ge and 0.01 to 15 atm % in the case of Sn. When not less than two kinds of elements are contained in the film, the content of each element should not be more than each respective maximum content and the total content should not be more than 20 atm %.

When the content of elements of group IVA is less than 0.01 atm %, the properties of the film are almost equal to those of a conventional hard carbon film and therefore there are caused the same problems as when a conventional carbon film is formed on a metal substrate. On the other hand, when the content of elements of group IVA is more than 20 atm %, there are caused problems of reduction in adhesive strength, insulating property and hardness, and of increase in internal stress.

The preferable content of elements of group IVA in the film varies depending on the kind and surface condition of the substrate, the kind of elements of group IVA, and the like. For example, a preferable content is 0.01 to 10 atm % when Si is contained in a stainless steel substrate.

Though the thickness of the hard carbon film is not particularly limited in the present invention, the thickness of 10 Å to 100 μm, preferably 20 Å to 30 μm is considered to be producible, because the film is produced by a method using plasma or ions.

Examples of components constituting the hard carbon film in the present invention besides the above-mentioned elements of group IVA include, for example, carbon, hydrogen used to form conventional hard carbon films, and oxygen residing at the surface of the film. The content for each in the film is about 0 to 20 atm %, preferably 0 to 5 atm % in the case of hydrogen, and about 0 to 5 atm %, preferably 0 to 0.1 atm % in the case of oxygen.

In case of fluorine-containing hydrocarbon such as $CF_4$, $CF_2H_2$ or $CF_eH$ is used without using a hydrocarbon which is generally used as carbon source and hydrogen source, there can be obtained a film containing both hydrogen and fluorine in the film. Further, in case of chlorine-containing hydrocarbon such as $CCl_4$ or $CCl_2H_2$ is used, there can be obtained a film containing both chlorine and hydrogen. From the viewpoint fo film hardness, a film containing solely hydrogen, or both hydrogen and fluorine is preferable, since the hardness of the film containing chloride is small. A chlorine content which is not less than five times that of hydrogen in the number of atoms tends to cause a problem of exfoliation of the film.

When Si and Ge are contained in a hard carbon film, the content of Si and Ge are preferably not more than 10 atm % and not more than 10 atm %, respectively.

When the content of Si is more than 10 atm %, or that of Ge is more than 10 atm %, the hardness of the film is apt to be lower, depending on the content of other elements of group IVA.

The above-mentioned hard carbon film in the present invention is generally made of diamond or diamond-like carbon. The surface Vickers hardness thereof is 500 to 10000, preferably 1000 to 10000, and more preferably 2500 to 10000. The insulation resistance is $10^2$ to $10^{16}$ Ω·cm, preferably $10^8$ to $10^{16}$ Ω·cm. The adhesive strength to the metal substrate is 5 to 200 kg/cm², preferably 20 to 200 kg/cm². The hard carbon film in the present invention is suitably used in insulated substrates for an electronic circuit, wear-resistant surface coating, and the like.

The hard carbon film in the present invention can be formed as an interlayer on a metal substrate such as stainless steel in the thickness of 10 to 5000 Å, preferably 20 to 2000 Å, thereafter a carbon film containing substantially no element of group IVA can be formed thereon. In that case, due to the existence of the interlayer, there can be obtained good adhesion between the metal substrate and the interlayer, and between the interlayer and the carbon film containing substantially no carbon.

Si is not necessarily contained in the film uniformly, but the distribution thereof might be in a gradient, or patternwise. That is, the predetermined content has only to be contained in the film as a whole.

Next, there is hereinafter explained a method of producing a hard carbon film in the present invention.

The hard carbon film in the present invention is produced by the reaction of a conventional mixed gas consisting of gases of one or more carbon-containing compounds such as methane, ethane, ethylene, carbon tetrafluoride, acetylene and benzene, and $H_2$ or an inert gas such as Ar, He or the like together with a very small amount of one or more gases selected from the group consisting of gases of silicon-containing compounds such as $SiH_4$, $Si_2H_6$, $SiF_4$, $SiCl_4$, $SiH_2F_2$ and $SiH_3F$; gases of germanium-containing compounds such as $GeH_4$, $Ge_2H_6$, $GeF_4$, $GeCl_4$, $GeH_2F_2$ and $GeH_3F$; and gases of tin-containing compounds such as $SnH_4$, $SnF_2H_2$, $SnF_3F$, $SnCl_4$ and $SnF_2H_2$. Of course, it is not necessary to control the amounts of carbon-containing compounds and inert gases so as to give the same composition as that used in the conventional method of producing a hard carbon film.

There is no particular limitation on the ratio of gas containing elements of group IVA to the carbon-containing compound gas. Thus, the ratio is optional as long as the produced hard carbon film has a predetermined composition. However, in order to give such predetermined composition, the ratio of addition of gas containing elements of group IVA is generally about 0.001 to 10%, preferably about 0.01 to 1% by volume.

For example, when a gas containing elements of group IVA is added to a carbon-containing gas in the above-mentioned proportion and the hard carbon film of the present invention is formed by a plasma CVD method such as DC plasma CVD method, RF plasma CVD method, mixed plasma CVD method of RF and DC wherein a magnetic field falling at right angles with the electric field is provided on the substrate, the resulting hard carbon film has a Group IVA element content within the required range, good adhesive strength and small internal stress. The content of elements of group IVA in the carbon film can be easily measured by ESCA.

The formation of the hard carbon film might be carried out by a usual plasma CVD method. However, when the substrate is disposed on the cathode, a voltage of −300 V to −1 kV is applied to the substrate and a DC plasma CVD method is carried out using the above gas, the resulting film has greater hardness and higher electrical resistivity as compared with the film produced by the usual RF plasma CVD method.

The detailed mechanism whereby the obtained film has good adhesive strength due to the existence of a very small amount of elements of group IVA without exfoliation problems is not yet elucidated. However, it is considered that elements of group IVA contribute to nucleation to reduce the internal stress or improve the adhesive strength to the substrate. That is, carbon, for example, has a mixed form of $sp^3$, $sp^2$ and sp, and $sp^3$ is predominant in the case of silicon, germanium and tin whereby silicon, germanium and tin retain $sp^3$ bond in the growth phase of the film to contribute to nucleation.

A hard carbon film in the present invention can be produced, for example, by using a DC plasma CVD method under the following conditions:

| Reaction gas: | $CH_4$ | 1 to 50 SCCM |
|---|---|---|
| | $SiH_4$ | 0.01 to 1 SCCM |
| | $H_2$ | 10 to 500 SCCM |
| Pressure in the reaction chamber: | 0.1 to 4 Torr | |
| Substrate temperature: | room temperature to 400° C. | |
| Applied voltage: | −200 V to −1 kV | |
| DC current: | 0.05 to 6 mA/cm$^2$ | |

Another example of production conditions using a DC plasma CVD method is as follows:

| Reaction gas: | $CH_4$ | 1 to 50 SCCM |
|---|---|---|
| | $GeH_4$ | 0.1 to 1 SCCM |
| | $H_2$ | 10 to 500 SCCM |
| Pressure in the reaction chamber: | 0.1 to 10 Torr | |
| Substrate temperature: | room temperature to 500° C. | |
| Applied voltage: | −300 V to −2 kV | |
| DC current: | 0.14 to 6 mA/cm$^2$ | |

Figure 2:
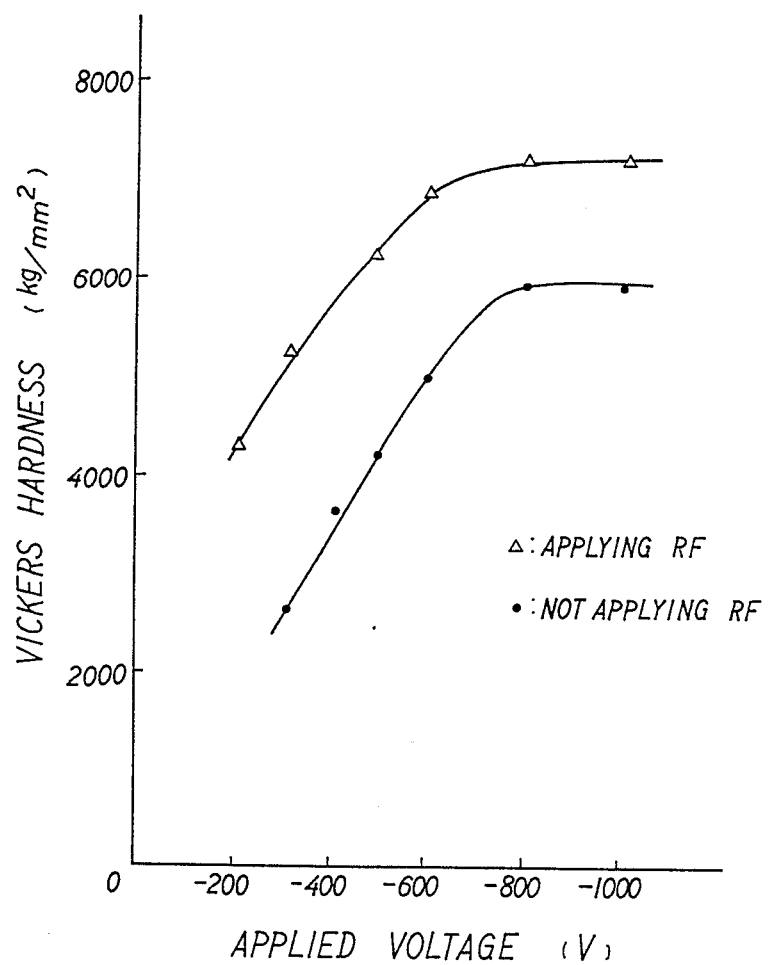
FIG. 2 is a graph showing that the Vickers hardness of a deposited film is different in the case of applying RF power as compared to applying no RF power, and depends on the applied voltage when an insulating layer comprising hard carbon of the present invention is produced.

Further, when 14 to 200 mW/cm$^2$ of RF is added to the above DC plasma, discharging is maintained and kept stable even when the insulatng material is deposited on the substrate and the deposition velocity is increased, whereby the hardness of the produced film is also increased as shown in FIG. 2.

FIG. 2 shows the results obtained when 40 SCCM of $CH_4$, 100 SCCM of $H_2$ and 0.1 SCCM of $SiH_4$ were added, a substrate made of stainless steel is set on the cathode, and a voltage in the range indicated in FIG. 2 is applied to substrate at a reaction chamber pressure of 1 Torr and a substrate temperature of 350° C. to deposit a carbon film on the substrate. The graph in FIG. 2 indicates that the Vickers hardness of the deposited film differs depending on whether 100 mW/cm$^2$ of RF is added or not, and that the film hardness varies also depending on the voltage applied. A graph similar to FIG. 2 is obtained when $GeH_4$ is used instead of $SiH_4$.

Figure 3:
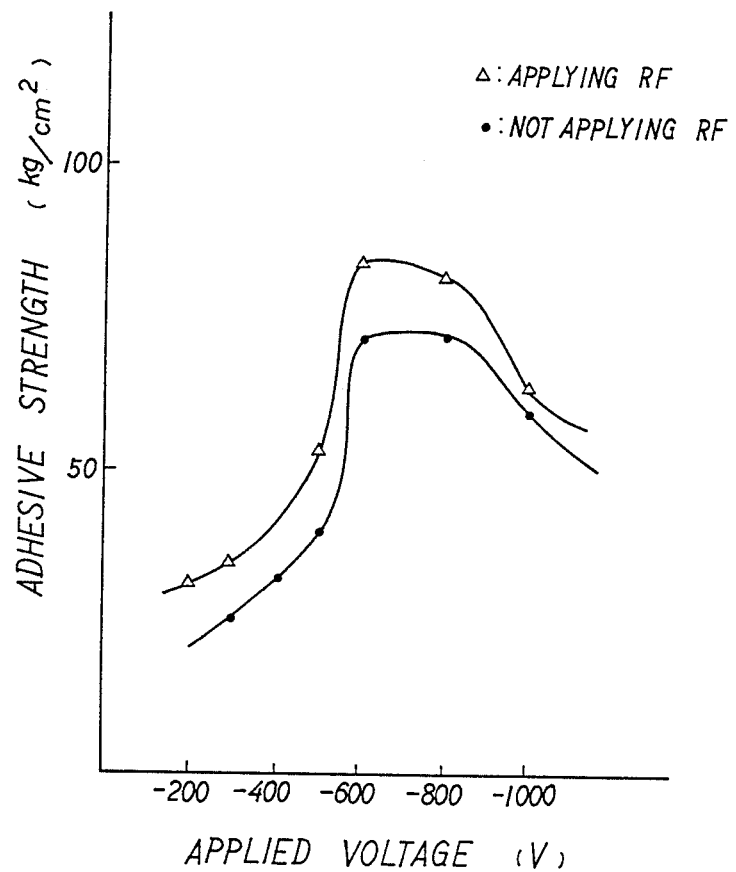
FIG. 3 is a graph showing that the adhesive strength of a deposted film is different in the case of applying RF power as compared to applying no RF power, and depends on the applied voltage when an insulating layer comprising hard carbon of the present invention is produced.

FIG. 3 is a graph indicating that the adhesive strength of the film is also different depending on whether RF is added or not, and that the adhesive strength also varies depending on the voltage applied.

Figure 4:
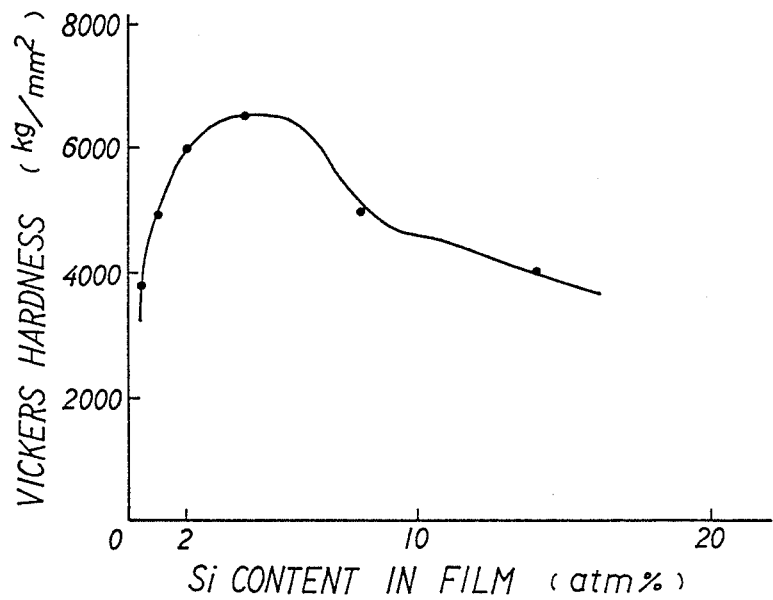
FIGS. 4 to 6 are graphs showing the relationships of silicon content and Vickers hardness, adhesive strength and internal stress, respectively.
Figure 5:
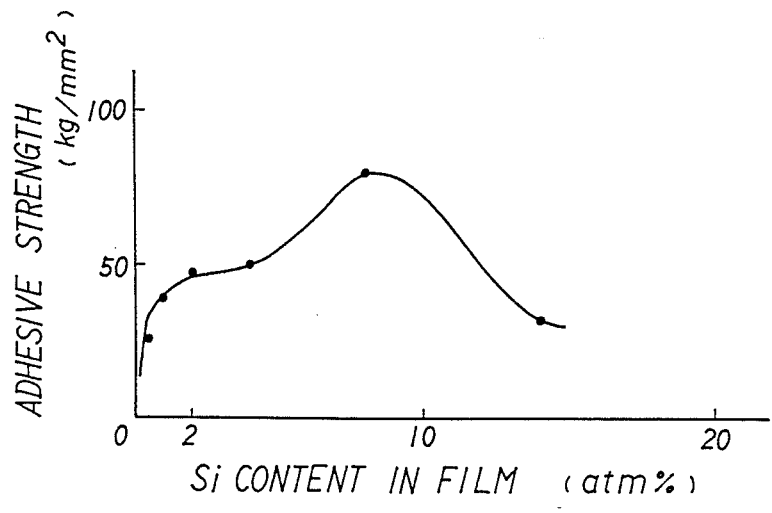
Figure 6:
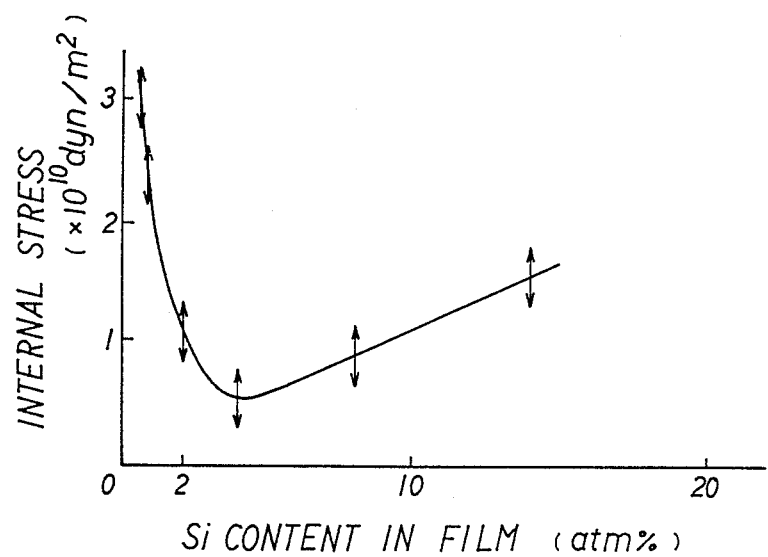

FIGS. 4, 5 and 6 are graphs showing the relationship between the Vickers hardness and silicon content in the film formed on the SUS substrate under the conditions set forth in Example 20 which appears hereinafter, and the relationship between the adhesive strength and silicon content in the film and the relationship between the internal stress and silicon content in the film, respectively. From these graphs, it is apparent that the introduction of silicon into the film results in a decrease of internal stress and increase of Vickers hardness and adhesive strength. However, an excessively high silicon content leads to a diminution of these effects.

The use of germanium or tin instead of silicon also leads to results similar to those obtained with silicon, although the optimum content of germanium or tin differs with different elements.

From the viewpoint of film hardness, with the DC voltage being held constant, the hardness is increased when a reactive gas such as methane as diluted with $H_2$ to a low concentration. Thus, when a hydrocarbon gas such as methane is diluted with hydrogen gas to a concentration of not more than 10% by volume, little film growth is observed unless a gas containing elements of group IVA such as $SiH_4$, $GeH_4$ or $SnH_4$ is added. On the contrary, film growth is observed when plasma CVD is carried out with $SiH_4$, $GeH_4$ or $SnH_4$ added in a very small amount (about 500 ppm based on methane). Moreover, in this case, an exceedingly high film hardness can be obtained.

While the foregoing description relates to the production of the hard carbon film by the plasma CVD method, the hard carbon film of the present invention can also be obtained by other plasma methods or by the method of forming films utilizing ion beams.

For example, there can be employed a reactive sputtering method using graphite as a target and plasma of a mixed gas consisting of a gas containing a very small amount of elements of group IVA and argon gas, reactive ion beam sputtering method, and ion beam vacuum evaporation method.

The above-mentioned hard carbon film in the present invention has small internal stress, is free of exfoliation problems, hard, good in electrical insulation property and shows a good adhesive property to metal substrates. Therefore, when applied to widely-used substrates made of stainless steel and the like, the film in the present invention is suitable as an insulated substrate for an electronic circuit, wear-resistant coating and other applications.

Next, there is described an insulated substrate having high thermal conductivity wherein the insulating layer comprises a multilayer film is which a layer of diamond and/or diamond-like carbon and a layer of silicon carbide are accumulated in turn.

In the gas-phase growth method used in the formation of the insulating layer in accordance with the present invention, the kind of substrate on which a film is formed is an important factor. Of course, a diamond and/or diamond-like carbon film can be formed on a diamond substrate. It is also possible to form a diamond and/or diamond-like carbon film on a silicon carbide or tungsten substrate which tends to form the corresponding carbide. In such cases, if amorphous carbon or graphite is precipitated as mentioned hereinbefore, a diamond and/or diamond-like film can hardly be deposited thereon. Therefore, it is difficult to form a thick and uniform film of diamond and/or diamond-like carbon. To avoid this problem, in the present invention, a very thin insulated film of silicon carbide is formed on the top of a very thin film of diamond and/or diamond-like carbon and such alternating layers are formed to give a multilayer. The silicon carbide film not only serves as an insulating layer but facilitates the formation of diamond and/or diamond-like carbon layers. This is because the preservation of $sp^3$ bonds of silicon carbide prevents precipitation of a $sp^2$ bonds-containing graphite layer on the silicon carbide layer. Generally, in the gaseous phase diamond growth method, there is a problem in that once graphite is formed, a further amount of graphite is deposited on the layer. However, in the multilayer film in the present invention, even if graphite is formed locally, the formation of a graphite layer is prevented by the overlaying silicon carbide layer. Moreover, because of the multilayer construction, no intergranular portions exist in the layer so that the dielectric breakdown voltage is increased and there is no decrease of thermal conductivity due to intergranular portions. Therefore, even when the film surface area is increased, an insulating film having high thermal conductivity and superior dielectric characteristics can be obtained. In regard to thermal conductivity, too, thermal conductivity equivalent to that of diamond can be obtained because silicon carbide is highly heat conductive and thin.

Figure 7:
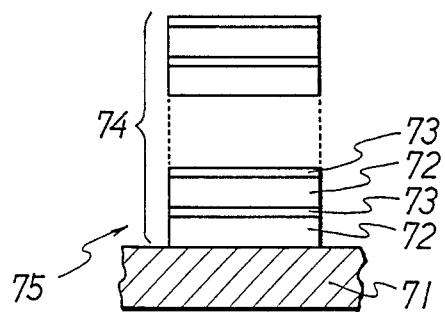
FIG. 7 is a sectional view showng the structure of an insulating layer in an insulated substrate having high thermal conductivity of the present invention wherein the insulating layer comprises a multilayer film.

The multilayer insulated substrate having high heat conductivity according to the present invention has a structure as shown in FIG. 7.

In FIG. 7, a multilayer insulated substrate having high thermal conductivity 75 is composed of substrate 71 and multilayer film 74. Any material can be used as the substrate material as long as it has a thermal conductivity of not less than 50 W/m.k. Representative examples of the materials used for the substrate are, for instance, silicon, aluminum, silicon carbide, tungsten, aluminum alloy, copper, copper alloy, and the like. Silicon, aluminum, silicon carbide and copper are preferred. A layer 72 of diamond and/or diamond-like carbon (hereinafter referred to as "diamond layer") is formed on the substrate 71, and a silicon carbide layer 73 is formed on the diamond layer 72. Further, on the silicon carbide layer 73, the layers 72 and layers 73 are alternately formed in that order, thus providing a multilayer film 74 composed of the diamond layers 72 and silicon carbide layers 73 on the substrate 71. The thicknesses of each diamond layer 72 and each silicon carbide layer 73 vary depending on film-forming conditions. Usually, the thickness of the diamond layer 72 is from 10 to 2,000 Å, and the thickness of the silicon carbide layer 72 is from 10 to 1,000 Å, preferably 10 to 300 Å. Under film-forming conditions which are apt to cause deposit of graphite, it is desirable to form the diamond layer 72 thin. Under film-forming conditions in which it is hard to deposit graphite, the thickness of the diamond layer 72 might be large. It is preferable that the silicon carbide layer 73 is as thin as possible, but it is required to have a thickness of at least 10 Å, since effects produced by providing the silicon layer are not otherwise obtained. In the case of microcrystalline silicon carbide or amorphous silicon carbide, silicon carbide of the formula: $Si_{1-x}C_x$ wherein x is from 0 to 0.99, can be used. It is desirable that the average value of x in the layer is from 0.1 to 0.8, especially from 0.4 to 0.6.

The reason why silicon carbide, diamond and diamond-like carbon are used as the components of the multilayer insulation film 74 is that they have very high thermal conductivity.

The thickness of the multilayer film 74 varies depending on the insulating property required in the intended uses. In general, it is from 1,000 Å to 20 μm.

It is preferable that the multilayer film 74 has higher thermal conductivity than the substrate 71. However, since the multilayer film 74 is thin, the thermal conductivity of the multilayer film 74 might be somewhat smaller than that of the substrate 71 so long as the obtained multilayer film-insulated substrate 75 has a thermal conductivity of at least 45 W/m.k.

A method for forming the diamond layer 72 and the silicon carbide layer 73 is described below.

Figure 8:
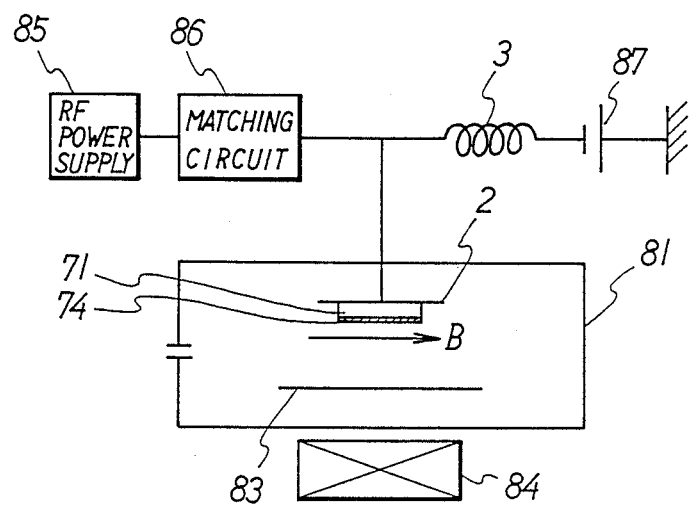
FIG. 8 is a schematic view explaining an apparatus for producing the insulated substrate having high thermal conductivity shown in FIG. 7 using a plasma CVD method.

FIG. 8 illustrates an apparatus similar to that shown in FIG. 1, used for forming the multilayer film 74 by a plasma CVD method. In FIG. 8, the same numerals as in FIGS. 1 and 7 indicate the same components or elements. The apparatus shown in FIG. 8 can perform mixed discharge of direct current discharge and radio frequency discharge, and has a magnetic field falling at right angles with the electric field. Numeral 81 is a reaction chamber into which raw material gases are introduced. The reaction chamber 81 is provided therein with electrode 2 and electrode 83 facing and in parallel with each other. The substrate 71 is fixed onto the surface of electrode 2 in contact with electrode 2 and facing electrode 83. A heater 84 for externally heating the substrate is provided on the outer periphery of reaction chamber 81. The apparatus includes radio frequency power source 85 from which radio frequency voltage is supplied through a matching circuit 86, and direct current power source 87 from which direct current voltage is supplied through a choking coil 3. The magnetic field is applied in the direction crossing the electric field at about right angles, namely in the direction parallel to the drawing paper (in the B direction shown in FIG. 8) and in the direction perpendicular to the drawing paper. The multilayer film is formed on the under surface of substrate 71 in FIG. 8, namely on the surface facing the electrode 83, by conducting a mixed discharge of DC discharge and RF discharge.

Under general conditions for forming the diamond layer, the flow rates of the raw material gases are from 100 to 500 SCCM for $H_2$ gas and from 10 to 20 SCCM for $CH_4$ gas. Also, the RF power is from 0.2 to 2 W/cm$^2$, the DC voltage is from $-200$ V to $-1$ kV, and the intensity of magnetic field is from 200 to 800 gausses.

The silicon carbide layer is formed generally under the following conditions: flow rate of $H_2$ gas of 100 to 500 SCCM, flow rate of $CH_4$ gas of 0.1 to 20 SCCM, flow rate of $SiH_4$ gas of 0.1 to 50 SCCM which is selected so as to be slightly lower than the $CH_4$ flow rate, RF power of 0.1 to 1 W/cm$^2$, DC voltage of $-300$ V to 1.5 kV, and intensity of magnetic field of 200 to 800 gausses.

Since the multilayer insulating film is formed by alternately depositing the diamond and silicon carbide layers on a thermally conductive substrate, an insulating film having high insulating property and high thermal conductivity can be obtained even if the film area is made large. The multilayer film-insulated substrate having high thermal conductivity according to the present invention is particularly useful as a substrate for integrated circuits.

An interlayer composed of a metal having a small coefficient of thermal expansion or an amorphous material might be provided partly or wholly between the substrate and the insulating layer.

Figure 9:
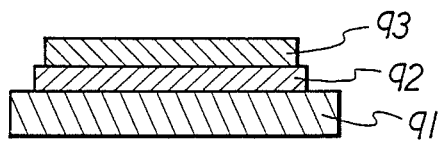
FIG. 9 is a sectional view showing the structure of an insulated substrate having high thermal conductivity of the present invention wherein an interlayer is interposed between a substrate and insulating layer.

In the insulated substrate having high thermal conductivity of the present invention shown in FIG. 9, an interlayer 92 is formed on at least a part of a metal substrate 91 having a high thermal conductivity, and insulating layer having high thermal conductivity 93 is formed on the intermediate layer.

In this embodiment, any metal substrate made from materials generally used as metal substrates can be used without restriction so long as they have a thermal conductivity of at least 50 W/m.k, e.g. Cu, Cu alloy, Al and Al alloy such as Al-Si alloy.

The expression "providing an interlayer on at least a part of a substrate" or similar expression as used herein means that the interlayer is formed in the desired size and shape on the portion required to form the insulating layer having thermal conductivity on the metal substrate having high thermal conductivity. The interlayer 92 might be formed on the entirety of one or both surfaces of the metal substrate, or may be formed patternwise on a part of the metal substrate.

The interlayer has the following two advantages.

Firstly, since the metal having high thermal conductivity used as a substrate material has a high coefficient of thermal expansion, the insulating layer having thermal conductivity easily forms cracks or fissures when the insulating layer, which has a small coefficient of thermal expansion, is formed directly on the metal substrate. The interlayer serves as a buffering layer so as to prevent the insulating layer from forming cracks or fissures.

Secondarily, the interlayer makes it possible or easy to form the insulating layer of a material having high thermal conductivity such as silicon carbide, amorphous silicon carbide, diamond or diamond-like carbon on the metal substrate. That is to say, the formation of the insulating layer is usually carried out by a plasma CVD method, but when the formation on the metal substrate is conducted by this method, the surface temperature of the substrate rises due to impingement of ions or the like, thus the insulating film becomes difficult to adhere to the substrate owing to the difference in coefficient between the metal substrate having high thermal conductivity and the insulating film. Even if the film is adhered to the substrate, it exfoliates when allowed to stand at room temprature. Also, sputtering caused by impingement of ions, particularly hydrogen ions, might occur. In the case of substrates of Cu, Cu alloy or Al which have a high sputter rate, the sputtering proceeds at a higher rate than the film deposition, thus resulting in no film formation. However, when the interlayer is present, the problem resulting from the difference in thermal expansion coefficient and the problem resulting from sputtering are prevented, thus the insulating layer having high thermal conductivity can be easily formed.

The materials used for forming the interlayer are for instance, a metal having a thermal expansion coefficient of not more than $15 \times 10^{31\ 6}$/K, preferably not more than $10 \times 10^{-6}$/K, at a temperature between room temperature and 500° C., and an amorphous material capable of relieving the difference in thermal expansion between the metal substrate and the insulating layer, such as amorphous silicon compounds. These materials might be used alone or in admixture thereof.

The thickness of the interlayer is from about 100 Å to about 5 μm, preferably from about 500 Å to about 3 μm. When the thickness is less than 100 Å, there is a tendency that it is difficult to sufficiently relieve the difference in thermal expansion or to form the insulating layer having high thermal conductivity. When the thickness is more than 5 μm, the heat conductivity of the obtained insulated substrate as a whole tends to be lower due to the influence of the thermal expansion coefficient of the interlayer.

Representative examples of the metal material used for forming the interlayer are, for instance, W, Mo, Pt, Ti, Ni, Ir, Cr, stainless steel, and the like. High melting metals having a low sputter rate owing to hydrogen ions, such as Mo, W and Cr, are preferred, since they are easy to form into insulating layers and adhere strongly to metal substrates.

The interlayer made of the metal materials as mentioned above is usually formed by a sputtering method, electron beam evaporation method, or the like.

Representative examples of the amorphous materials used for forming the interlayer are, for instance, amorphous silicon compounds such as a-Si, a-$Si_xC_{1-x}$, a-$Si_xN_{1-x}$, a-$Si_{x+y}C_{1-x}N_{1-y}$, a-$Si_{x+y}C_{1-x}O_{1-y}$, a-$Si_x$$Ge_{1-x}$, and a-$Si_{x+y}C_{1-x}Ge_{1-y}$ (in these formulas, x and y are values satisfying the equations: $0.001 \leq x \leq 1$ and $0.001 \leq x+y \leq 1$), other amorphous compounds, and the amorphous silicon compounds and other amorphous compounds containing at least one of hydrogen and halogens. Among them, the compounds containing at least one of hydrogen and halogens are preferred in that the interlayer formed therefrom has high structural flexibility, it can effectively relieve the difference in thermal expansion between the metal substrate and the insulating layer and it has a larger adhesion than the others.

The reaction gases used in forming the interlayer of amorphous materials are, for instance, a gas of a silicon-containing compound such as $SiH_4$, $Si_2H_6$, $SiF_4$, $SiH_3F$ or $SiCl_4$; a gas of a hydrocarbon or halogenated hydrocarbon compound such as $CH_4$, $C_2H_4$, $CF_4$, $C_2H_2$, $C_6H_6$ or $C_6H_3F_3$; a gas of a nitrogen-containing compound such as $NH_3$, $N_2$ or $NF_3$; a gas of a Ge-containing compound such as $GeH_4$ or $GeF_4$, and other gases such as $O_2$ and $H_2O$, but the gases usable in the invention are not limited thereto. Diluent gases such as $H_2$, Ar and He might be used.

A layer of an amorphous silicon compound formed by a plasma CVD method wherein a mixed discharge of DC discharge and RF discharge is conducted, and a negative high voltage is applied to a substrate, is particularly suitable as the interlayer on which the insulating layer having high thermal conductivity is formed. In particular, amorphous silicon carbide is preferred as the amorphous silicon compound from the viewpoint of having a good heat resistance and being hard to sputter. In producing such an amorphous silicon carbide, it is preferable to use $H_2$, $CH_4$, $SiH_4$ and $CF_4$ from the viewpoint of productivity, namely easiness in forming the film on only the desired place.

Amorphous silicon carbide is used in forming an interlayer and an insulating layer having high thermal conductivity. Amorphous silicon carbide used for an interlayer contains preferably not less than 20 atm % of hydrogen or halogen atoms, and amorphous silicon carbide used for an insulating layer having high thermal conductivity contains preferably crystallized particulates.

Examples of materials constituting an insulating layer having high thermal conductivity formed after the formation of an interlayer include, for instance, silicon carbide, amorphous silicon carbide, diamond, diamond-like carbon, cubic-BN, hexagonal-BN, all of which having high thermal conductivity. Using at least one of these materials, an insulating layer having high thermal conductivity can be formed which has a thickness of about 1000 Å to about 200 $\mu m$, preferably 5000 Å to 100 $\mu m$, electric conductivity of about not more than $10^{-19}$ $(\Omega \cdot cm)^{-1}$, preferably no more than $10^{-10}$ $(\Omega \cdot cm)^{-1}$, and withstand voltage of not less than 20 V/$\mu m$, preferably not less than 40 V/$\mu m$.

The insulating layer having high thermal conductivity can be formed by means of an ion beam method or thermal CVD method. But a plasma CVD method is preferable to obtain a layer having a large area. Though a diamond or diamond-like thin film using a microwave plasma CVD method has been vigorously investigated, a DC discharge plasma CVD method, RF discharge plasma CVD method or mixed plasma CVD method of DC discharge and RF discharge is preferable, because the operation is simple and a film having a large area can easily be made. The important point in forming an insulating layer having high thermal conductivity is to set a substrate on a cathode, and to dilute the raw material gas with hydrogen gas. The more preferable method is a mixed plasma CVD method of DC discharge and RF discharge wherein a magnetic field falling at right angles with the electric field is provided on the substrate. According to this method, there can be formed an insulating layer having a high thermal conductivity. In this method, it is also important to set a substrate on a cathode and to dilute the raw material gas with hydrogen gas. The reason why the insulated layer having high thermal conductivity is formed in this method is that crystallization is widely carried out. The crystallization is performed by generating a large amount of hydrogen radical, while controlling the energy distribution of electrons by appropriately adjusting the intensity of the magnetic field and electric field.

From the viewpoint of obtaining a layer having higher thermal conductivity, silicon carbide is more preferable than amorphous silicon carbide, and diamond is more preferable than diamond-like carbon.

Next, a method of producing an insulated substrate having high thermal conductivity wherein the above interlayer is provided is explained.

Figure 10:
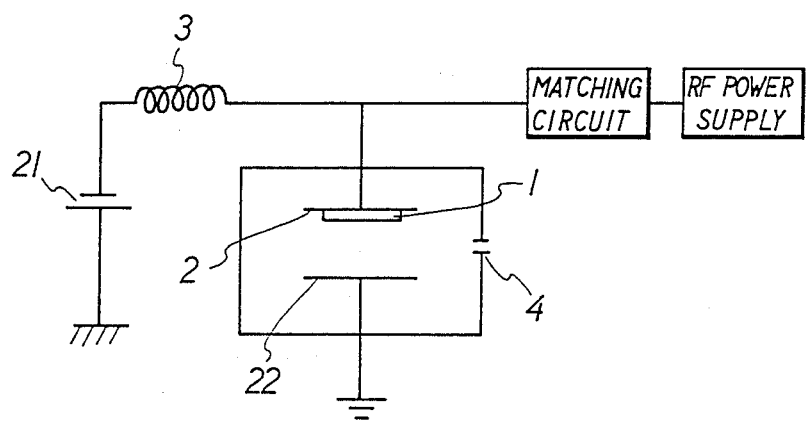
FIG. 10 is a view explaining an apparatus for producing the insulated substrate having high thermal conductivity show in FIG. 9.

FIG. 10 shows an apparatus like in FIG. 1 used in a plasma CVD method. In FIG. 10, the same numeral as in FIG. 1 shows the same component element as in FIG. 1. In FIG. 10, a Cu or Al substrate 1 of 0.2 of 5 mm thickness is set on the side of a cathode of the apparatus. Amorphous silicon carbide of about 3000 Å to 2 $\mu m$ thick is deposited on the substrate 1 while introducing a mixed reaction gas from a gas inlet 4 by means of a mixed plasma CVD method of DC discharge and RF discharge under the following conditions.

| | | |
|---|---|---|
| Reaction gas: | $H_2$ | 50 to 200 SCCM |
| | $SiH_4$ | 10 to 50 SCCM |
| | $CH_4$ | 10 to 50 SCCM |
| Pressure in the reaction chamber: | 0.1 to 5 Torr | |
| DC voltage: | −100 V to −2 kV | |
| DC current: | 0.14 to 10 mA/cm$^2$ | |
| RF power: | 10 to 500 mW/cm$^2$ | |

DC voltage is applied to electrodes 2 and 22 through a radio frequency choking coil 3 from DC power source 21.

The adhesive strength and surface Vickers hardness of the deposited film are 20 to 100 kg/cm$^2$ and 1000 to 3000, respectively. 1 to 30 atm % of hydrogen is contained in the film. The film has structural flexibility.

Next, a silicon carbide layer of 5000 Å to 30 $\mu m$ thickness as an insulating layer having high thermal conductivity is formed on the interlayer using almost the same apparatus as in FIG. 10, wherein a magnetic field falling at right angles with the electric field is provided on the cathode, by generating a mixed discharge of DC discharge and RF discharge.

The production conditions are as follows:

| | | |
|---|---|---|
| Reaction gas: | $H_2$ | 50 to 200 SCCM |
| | $CH_4$ | 5 to 30 SCCM |
| | $SiH_4$ | 10 to 60 SCCM |
| Pressure in the reaction chamber: | 0.1 to 10 Torr | |
| Intensity of magnetic field: | 100 to 1000 gausses | |
| DC voltage: | −150 V to −1 kV | |
| DC current: | 0.5 to 15 mA/cm$^2$ | |
| RF power: | 50 to 1000 mW/cm$^2$ | |
| Substrate temperature: | 200 to 800° C. | |
| Deposition velocity: | 1 to 15Å/sec | |

The greater part of the obtained film is formed to have generally a crystallization of the type of $\beta$-SiC, as found by X-ray diffraction analysis. Further, in IR spectrum analysis, a very small amount of hydrogen is found to exist in the film (i.e. a small absorption is found in the stretching mode of C-H and Si-H).

In order to form silicon carbide having high thermal conductivity, it is important to promote crystallization, to dilute the raw material gas with $H_2$ and to adjust the energy distribution of electrons by means of the three parameters of magnetic field, electric field and pressure in the reaction chamber.

The thermal conductivity of the obtained substrate is 0.35 to 0.90 cal/cm.sec.°C. around room temperature in case a Cu substrate is used as a metal substrate, which value is greatly influenced by the thickness and crystallization of the insulating film. It does not decrease even when the temperature is raised to around 100° C. The surface Vickers hardness is 2000 to 3500, which value is almost equal to that of single crystalline β-SiC. Further, the electrical conductivity and withstand voltage are not more than $10^{-12}$ $(\Omega \cdot cm)^{-1}$ and 50 to 200 V/μm, respectively. Exfoliation of the interlayer or silicon carbide layer from the Cu substrate is not at all observed after one thousand heat cycles wherein one cycle comprises keeping a substrate at $-55°$ C. for 30 minutes and at 150° C. for 30 minutes. The adhesive strength is 20 to 100 kg/cm², which value does not change even after the test is carried out. The exfoliation is generated between the interlayer and metal substrate, not between the interlayer and insulating layer. The insulated substrate is also suitable for a substrate for a thin film circuit, since the surface roughness thereof (average roughness along center line) is not more than 0.1 μm.

The insulated substrate having an amorphous silicon carbide layer as an interlayer is explained hereinbefore. Almost the same results can be obtained in case such metal as Mo and W is used as an interlayer.

For example, a metal having a low coefficient of thermal expansion such as Mo is vacuum evaporated on a Cu substrate by means of an electron beam vacuum evaporation plating method at a velocity of 1 to 5 Å/sec, thereafter the substrate whereon the metal is vacuum evaporated is set in an apparatus as shown in FIG. 10. In that case, like in forming silicon carbide, there is preferably provided a magnetic field falling at right angles with the electric field on the substrate which was set on a cathode. A film of 1 to 100 μm thickness is formed by means of mixed discharge of DC discharge and RF discharge under the following conditions. The substrate is preferably kept at 300° to 800° C.

| Reaction gas: | CH₄ | 1 to 5 SCCM |
|---|---|---|
| | CF₄ | 1 to 2 SCCM |
| | H₂ | 100 to 300 SCCM |
| Pressure in the reaction chamber: | 0.1 to 15 Torr | |
| Intensity of magnetic field: | 100 to 1000 gausses | |
| DC voltage: | −150 to −1 kV | |
| DC current: | 1 to 30 mA/cm² | |
| RF power: | 200 to 2000 mW/cm² | |
| Deposition velocity: | 0.1 to 5Å/sec | |

The surface Vickers hardness of the obtained film is very large, i.e. 6000 to 8000, which value is almost equal to that of natural diamond. IR spectrum analysis showed no hydrogen. It is found by transmission electron diffraction (TED) that a ring corresponding to (111) and (220) of diamond is produced. The obtained film is such a film as comprises so-called diamond-like carbon.

In order to form a film having properties approximate to those of diamond-like carbon in the above formation of a silicon carbide layer, it is important to adjust the energy distribution of electrons by means of the three parameters of magnetic field, electric field and pressure in the reaction chamber.

The production conditions which are different from those used in forming the above silicon carbide layer are that a higher RF power, DC voltage, DC current and pressure in the reaction chamber are employed in forming a metal layer.

The thermal conductivity of the substrate in case a Cu substrate is used as metal substrate is 0.5 to 0.9 cal/cm.sec.°C. around room temperature, and it does not decrease even when the temperature is raised up to around 100° C. The surface Vickers hardness is 6000 to 8000. The electrical conductivity and withstand voltage are not more than $10^{-12}$ $(\Omega \cdot cm)^{-1}$ and 40 to 300 V/μm, respectively. Exfoliation is not observed in the heat cycle test. The adhesive strength is 20 to 100 kg/cm², which value is the same as that before the test.

The surface Vickers hardness of the substrate of the present invention produced in such a manner as described above is preferably not less than 500, more preferably not less than 1500. Further, the thermal conductivity of the insulated substrate is not less than 0.2 cal/cm.sec.°C., more preferably not less than 0.35 cal/cm.sec.°C., which value is approximate to that of the metal substrate having high thermal conductivity, because the thickness of the interlayer and insulating layer having thermal conductivity is small, and the thermal conductivity of the insulating layer is high. The coefficient of thermal expansion of the insulating layer having thermal conductivity is almost equal to that of silicon, in the case where the insulating layer is composed of silicon carbide, amorphous silicon carbide, diamond, diamond-like carbon, cubic-BN, hexagonal-BN, and the like, whereby the properties of devices are not lowered due to the difference in coefficient of thermal expansion. There can be obtained an insulating layer having thermal conductivity which has superior surface smoothness when the layer is produced by means of a plasma CVD method.

In the insulated substrate having high thermal conductivity, there are formed a specific interlayer on a metal substrate having high thermal conductivity and thereafter an insulating layer having thermal conductivity on the interlayer. Therefore, the insulating layer having thermal conductivity is stably and firmly attached to the metal substrate. The substrate of the present invention is preferably used for electronic parts such as a hybrid IC substrate, since the substrate of the present invention has high thermal conductivity, electrical insulating property and hardness.

Further, in accordance with the above method, there can be obtained substrates of the present invention having the above-mentioned interlayers that can be produced on an industrial scale.

Next, Examples and Comparative examples of the present invention are explained. Examples 1 to 5 correspond to a substrate comprising crystalline silicon, Examples 6 to 13 and Comparative Example 1 correspond to a substrate comprising nitrated or oxidized crystalline silicon, Examples 14 to 20 and Comparative Example 2 to 5 correspond to a metal substrate provided with an insulating layer of hard carbon material, examples 21 to 24 correspond to a substrate comprising a multilayer insulating film, and Examples 25 to 29 correspond to a substrate comprising an interlayer.

EXAMPLES 1 TO 2

A SiC film was formed on single crystalline silicon using a plasma CVD apparatus as shown in FIG. 1.

A silicon substrate 1 of 100×100×0.5 mm was set on the side of RF closing electrode 2 as shown in FIG. 1. DC voltage was applied through a radio frequency choking coil 3. Magnetic field B was provided near the substrate in a direction falling at right angles to the direction of the electric field, that is, parallel to the surface of the silicon substrate. The intensity of the magnetic field was 100 to 500 gausses. In this apparatus, the substrate was heated up to 200° to 300° C. and there was carried out a mixed discharge of DC discharge and RF discharge to obtain a silicon carbide film of about 3 to 5 $\mu$m thickness under the following conditions.

| Reaction gas (introduced from gas inlet 4): | $H_2$ | 100 to 200 SCCM |
|---|---|---|
| | $CH_4$ | 20 to 80 SCCM |
| | $SiH_4$ | 10 to 60 SCCM |
| RF power: | | 100 to 300 W (140 to 420 mW/cm$^2$) |
| DC voltage: | | −150 to −400 V |
| Pressure in the reaction chamber: | | 0.3 to 5 Torr |
| Reaction time: | | about 1 hour |

The obtained film was found to be microcrystalline $\beta$-SiC in X-ray diffraction analysis. Further, by IR measurement, it was found that there existed hydrogen connected to carbon and silicon in the film. The hydrogen content in the film was 1 to 15 atm %.

The characteristics of the obtained films are summarized in Table 1. In Table 1, the thickness of films is about 5 $\mu$m, and the carbon content in the films is 40 atm % or 60 atm %.

The characteristics varied depending on the silicon content and carbon content. In general, the hardness increased and thermal conductivity decreased when the carbon content was more than 50 atm %.

The reason why the obtained insulated substrate has a smaller dielectric constant in comparison with highly thermally conductive SiC obtained by means of a conventional sintering operation is considered to be that SiC consists of both hydrogen-containing amorphous silicon carbide and crystalline SiC, and not of a perfect crystal or polycrystal, accordingly the dielectric constant is reduced by the hydrogen-containing amorphous portion and the heat conductivity is increased by the crystalline portion.

EXAMPLE 3

An insulated substrate was made in the same manner as in Example 1 using a conventional RF plasma CVD apparatus having neither magnetic field nor DC power. The obtained film was amorphous. The characteristics of the film containing 40 atm % of carbon are shown in Table 1. The obtained film had superior insulating property and thermal conductivity of 50 to 90 W/m.k.

EXAMPLE 4

A diamond-like carbon film about 3 to 5 $\mu$m thick was obtained using the same apparatus as in example 1 under the following conditions:

| Intensity of magnetic: | 300 to 1000 gausses |
|---|---|
| Substrate temperature: | 250 to 350° C. |
| Reaction gas: | $H_2$ 100 to 300 SCCM |
| | $CH_4$ 1 to 10 SCCM |
| RF power: | 100 to 400 W |
| | (140 to 560 mW/cm$^2$) |
| DC voltage: | −200 to −600 V |
| Pressure in the reaction chamber: | 0.1 to 20 Torr |
| Reaction time: | 2 hours |

The experimental conditions of Example 4 differ from those of Example 1 in that the RF power and DC voltage in Example 4 are higher than those in Example 1, and $CH_4$ is diluted with $H_2$ to not more than 10% by volume in Example 4. The surface Vickers hardness of the obtained film was 6000 to 8000, which value was approximate to that of natural diamond. As a result of TED (Transmission Electron Diffraction) analysis, the generation of diamond particles was observed. The characteristics of the obtained films varied depending on the production conditions. The characteristics of a film 5 $\mu$m thick obtained by using methane of relatively low concentration (i.e. not more than 5% by volume) are shown in Table 1. The adhesive strength was small (i.e. 20 to 50 kg/cm$^2$).

EXAMPLE 5

A diamond-like carbon film was made under the same conditions as in Example 4 except that 0.1 to 7% by weight of silane gas or 0.1 to 5% by volume of hydrogenated germanium gas was added to methane gas.

The characteristics of the film obtained by adding 0.5% by volume of silane gas to methane gas are shown in Table 1.

As a result of ESCA measurement, 1 atm % of silicon was observed in the film.

The internal stress of the obtained diamond-like carbon film containing a very small amount of silicon was very small. The adhesive strength was several times larger than for a film which does not contain silicon, and further the electrical insulation property was improved.

TABLE 1

| | Ex. 1 | Ex. 2 | Ex. 3 | Ex. 4 | Ex. 5 |
|---|---|---|---|---|---|
| Insulating layer | SiC$_{40}$ | SiC$_{60}$ | a-SiC$_{40}$ | Diamond-like carbon | Diamond-like carbon |
| Thermal conductivity (room temperature) (W/m · k) | 100 to 120 | 90 to 110 | 50 to 90 | 100 to 120 | 100 to 120 |
| Coefficient of thermal expansion ($\times 10^{-6}$/°C.) | 3.3 to 3.6 | 3.3 to 3.6 | 3.3 to 3.7 | 3.3 to 3.6 | 3.3 to 3.6 |
| Electrical resistivity ($\Omega$ · cm) | >$10^{14}$ | >$10^{14}$ | >$10^{14}$ | >$10^{11}$ | >$10^{13}$ |
| Dielectric constant (1 MHz) | 12 to 15 | 12 to 20 | 12 to 15 | 12 to 15 | 12 to 15 |

TABLE 1-continued

|  | Ex. 1 | Ex. 2 | Ex. 3 | Ex. 4 | Ex. 5 |
|---|---|---|---|---|---|
| Dielectric loss (1 MHz) | 0.01> | 0.01> | 0.01> | 0.01> | 0.01> |
| Vickers hardness (kg/mm$^2$) | 2500 to 3000 | 3000 to 3500 | 800 to 900 | 7000 to 8000 | 7000 to 8000 |
| Adhesive strength (kg/cm$^2$) | 100 to 150 | 100 to 150 | 20 to 60 | 20 to 50 | 50 to 150 |
| Withstand voltage | 1 kV< | 600 kV< | 1 kV< | 250 V< | 700 V< |

EXAMPLES 6 TO 13 AND COMPARATIVE EXAMPLE 1

Through holes of 0.5 mm$\phi$ were made on a single crystalline Si substrate 0.5 mm thick. After being trimmed and grinded, the substrate was put in a plasma CVD apparatus. The substrate was set on the side of the RF electrode and then plasma oxidation was performed by RF (Radio Frequency) of 13.56 MHz under the following conditions, while introducing $O_2$ of 0.1 Torr into the apparatus.

| DC voltage: | −100 V |
|---|---|
| RF power: | 0.1 W/cm$^2$ |
| Reaction temperature: | Room temperature |

The thickness of the oxidized layer was measured by means of SIMS.

Next, the substrate was heated up to 200° C. and a-SiC having Eg of 2.5 eV was deposited thereon using RF under the following conditions.

| Reaction gas: | SiH$_4$ and CH$_4$ |
|---|---|
| DC voltage: | −50 V |
| Pressure in the reaction chamber: | 0.5 Torr |
| RF power: | 0.1 W/cm$^2$ |

The thermal conductivity of the obtained substrate was measured by the laser flash method. The electric conductivity was measured in the surface direction of a-SiC wherein Al electrodes were provided parallel to each other, and in the direction of the thickness of a-SiC, namely in the direction vertical to the surface of the layer.

The thermal resistance was evaluated by observing the change of the a-SiC film after repeatedly raising the temperature thereof three times up to 500° C.

The results are summarized in Table 2. In Table 2, A means "excellent", B means "good" and C means "poor".

a film of 10000 Å thickness on the substrate 3 under the following conditions.

| Reaction gas | CH$_4$ 40 SCCM |
|---|---|
|  | H$_2$ 200 SCCM |
|  | SiH$_4$ 0.2 SCCM |
| Pressure in the reaction chamber | 1 Torr |
| DC voltage | −500 V |
| RF Power | 100 mW/cm$^2$ |
| Substrate temperature | 350° C. |

Figure 11:
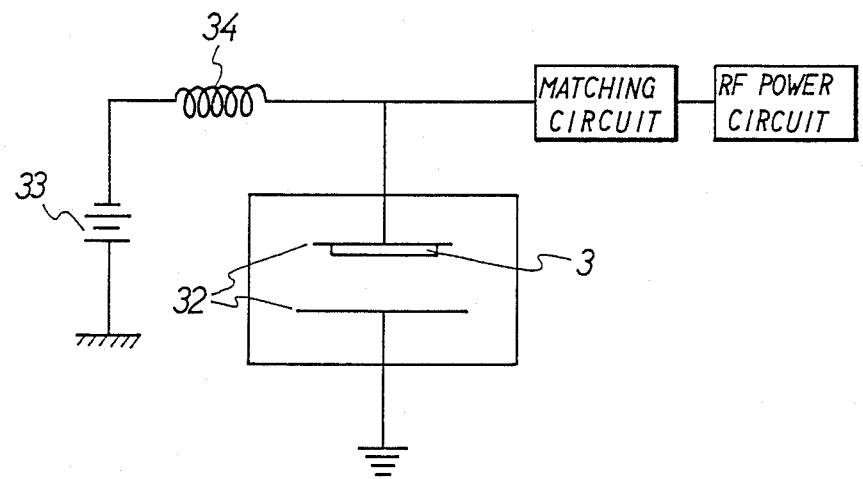
FIG. 11 is a view explaining a plasma CVD apparatus used in producing an insulating layer comprising hard carbon of the present invention.

In FIG. 11, numeral 32 is an electrode, numeral 33 is DC power and numeral 34 is a RF choking coil. The Vickers hardness and adhesive strength of the deposited film were about 6000 and about 50 kg/cm$^2$, respectively. 2 atm % of silicon was found to be contained in the film according to ESCA measurement. The electrical resistivity of the film was more than $10^{12}$ $\Omega$.cm and the coefficient of friction thereof was 0.2. The film was not exfoliated by one hundred heat cycles from room temperature to 300° C. after leaving the film for one month.

On the other hand, a film (Comparative Example 2) obtained by the same method as in Example 14 except that silane gas was not used was exfoliated just after taking the obtained film out, or after leaving it for one to three days.

EXAMPLE 15 AND COMPARATIVE EXAMPLE 3

A hard carbon film was produced using the same apparatus as shown in FIG. 11. A substrate made of Al-Si was set in the apparatus in the same manner as in the substrate made of stainless steel. A film was deposited under the following conditions.

| Reaction gas | CH$_4$ 40 SCCM |
|---|---|
|  | H$_2$ 100 SCCM |
|  | SiH$_4$ 0.1 SCCM |
| Pressure in the reaction chamber | 1 Torr |
| DC voltage | −200 to −1 kV |

TABLE 2

|  | Com. Ex. 1 | Ex. 6 | Ex. 7 | Ex. 8 | Ex. 9 | Ex. 10 | Ex. 11 | Ex. 12 | Ex. 13 |
|---|---|---|---|---|---|---|---|---|---|
| Thickness of SiO$_2$ ($\mu$m) | 0 | 0.1 | 0.5 | 1.0 | 0.5 | 0.5 | 0.5 | 0.5 | 0.5 |
| Thickness of a-SiC ($\mu$m) | 3 | 3 | 3 | 3 | 0.5 | 1 | 5 | 10 | 20 |
| Heat conductivity (W/m · °C.) | 125 | 125 | 120 | 115 | 130 | 130 | 115 | 105 | 80 |
| Electric conductivity (parallel to the surface of the layer) ($\Omega$ · cm)$^{-1}$ | $10^{-15}$ | $10^{-15}$ | $10^{-15}$ | $10^{-16}$ | $10^{-14}$ | $10^{-14}$ | $10^{-15}$ | $10^{-16}$ | $10^{-16}$ |
| Electric conductivity (vertical to the surface of the layer) ($\Omega$ · cm)$-1$ | $10^{-13}$ | $10^{-14}$ | $10^{-15}$ | $10^{-16}$ | $10^{-8}$ | $10^{-10}$ | $10^{-15}$ | $10^{-16}$ | $10^{-16}$ |
| Thermal resistance | C | A or B | A | A | A | A | A | A | B |

EXAMPLE 14 AND COMPARATIVE EXAMPLE 2

A substrate 3 made of stainless steel was set in a plasma CVD apparatus as shown in FIG. 11 to deposit A film was obtained under the same conditions as described above except that RF of 100 mW/cm² was further applied to the substrate.

FIG. 2 shows the relationship of surface Vickers hardness of the obtained films and applied voltage, and further the relationship in the case RF power is applied. The surface hardness increases with the increase of applied voltage till about $-800$ V, but is likely to saturate when the applied voltage exceeds about $-800$ V. The content of silicon in the film was found to be about 2 atm % regardless of the value of applied voltage by ESCA measurement. The adhesive strength of the films is shown in FIG. 3.

On the other hand, a film (Comparative Example 3) obtained by the same method as in Example 14 except that silane gas was not used was exfoliated just after taking out the obtained film or after leaving it for one to seven days.

EXAMPLE 16

A hard carbon film was produced using a substrate made of stainless steel in the same apparatus as in FIG. 11. The used apparatus can further provide, on the substrate surface, a magnetic field which falls at right angles with electric field. The conditions for producing a film were as follows:

| Intensity of magnetic field | 200 gauss |
|---|---|
| Reaction gas | $CH_4$ 40 SCCM |
| | $H_2$ 200 SCCM |
| | $SiH_4$ 0.2 SCCM |
| Substrate temperature | 350° C. |
| DC voltage | $-250$ V |
| RF power | 100 mW/cm² |
| Pressure in the reaction chamber | 1 Torr |

The deposition velocity of the film was 10 Å/sec, and the thickness thereof was 10000 Å. Plasma having high density can be generated at low applied voltage due to the existence of a magnetic field which falls at right angles with the electric field when using the above apparatus.

2 atm % of silicon was contained in the obtained film, and the surface Vickers hardness, adhesive strength, electrical resistivity and coefficient of friction were 7000, 90 kg/cm², $10^{14}$ Ω.cm and 0.20, respectively. Exfoliation was not observed after one thousand heat cycles from $-60°$ C. to 300° C.

EXAMPLE 17 AND COMPARATIVE EXAMPLE 4

A substrate 31 made of stainless steel was set in a plasma CVD apparatus as shown in FIG. 11 to deposit a film 3 μm thick on the substrate 31 under the following conditions.

| Reaction gas | $CH_4$ 40 SCCM |
|---|---|
| | $H_2$ 200 SCCM |
| | $GeH_4$ 0.2 SCCM |
| Pressure in the reaction chamber | 1 Torr |
| DC voltage | $-500$ V |
| RF power | 100 mW/cm² |
| Substrate temperature | 350° C. |

The deposition velocity was 2 Å/sec. The Vickers hardness and adhesive strength of the obtained film were about 6000 and 50 kg/cm², respectively. 1.5 atm % of Ge was contained in the film. Further, the electrical resistivity and coefficient of friction of the film were more than $10^{12}$ Ω.cm and 0.2, respectively. The film did not exfoliate after one thousand heat cycles after the film was left for one month, wherein the heat cycle comprises keeping the film at $-55°$ C. for 30 minutes and at 200° C. for 30 minutes.

On the other hand, a film (Comparative Example 4) obtained by the same method as in Example 17 except that $GeH_4$ was not used was exfoliated just after taking the obtained film out, or after leaving it for one to three days.

EXAMPLE 18 AND COMPARATIVE EXAMPLE 5

A film 2 μm thick was produced on a substrate made of stainless steel using the same apparatus as in FIG. 11 which can further provide, on the substrate surface, a magnetic field falling at right angles with the electric field, under the following conditions.

| Reaction gas | $CH_4$ 10 SCCM |
|---|---|
| | $H_2$ 200 SCCM |
| | $GeH_4$ 0.05 SCCM |
| Pressure in the reaction chamber | 1 Torr |
| DC voltage | $-400$ V |
| RF power | 100 mW/cm² |
| Intensity of magnetic field | 400 gausses |
| substrate temperature | 300° C. |

The deposition velocity was 3 Å/sec.

The Vickers hardness, adhesive strength, electrical resistivity and coefficient of friction of the film were 8000, (which value is almost equal to that of natural diamond), 40 kg/cm², more than $10^{12}$ Ω.cm and 0.2, respectively. 2 atm % of Ge was contained in the film. The film did not exfoliate after one thousand heat cycles like in Example 17.

The adhesion of the film onto the substrate was not observed when carrying out the discharge excluding $GeH_4$ from the above reaction gas. From this fact, it can be conjectured that Ge plays an important role in the growth of the core.

EXAMPLE 19

A hard carbon film was produced using a substrate made of stainless steel in the same apparatus as in FIG. 11. The used apparatus can further provide, on the substrate surface, a magnetic field which falls at right angles with electric field.

The conditions for producing a film were as follows:

| Intensity of magnetic field | 200 gausses |
|---|---|
| Reaction gas | $CH_4$ 20 SCCM |
| | $H_2$ 200 SCCM |
| | $SnH_4$ 0.1 SCCM |
| Substrate temperature | 350° C. |
| DC voltage | $-280$ V |
| RF power | 50 mW/cm² |
| Pressure in the reaction chamber | 1 Torr |

The deposition velocity of the film was 7 Å/sec.

The obtained film contained 2 atm % of Sn and the surface Vickers hardness, adhesive strength and electrical resistivity of the film were 6000, 80 kg/cm² and more than $10^{13}$ Ω.cm, respectively. The film did not exfoliate after one thousand heat cycles like in Example 17.

EXAMPLE 20

A hard carbon film 1 μm thick was produced using a substrate made of stainless steel in the same apparatus as in FIG. 11 under the following conditions.

| Pressure in the reaction chamber | 1 Torr |
|---|---|
| Substrate temperature | 350° C. |
| RF power | 100 mW/cm² |
| DC voltage | −500 V |
| Reaction gas | CH₄ 40 SCCM |
| | H₂ 200 SCCM |
| | SiH₄ (flow rate shown in Table 3) |

TABLE 3

| | No. | | | | | |
|---|---|---|---|---|---|---|
| | a | b | c | d | e | f |
| Flow rate of SiH₄ (SCCM) | 0.05 | 0.1 | 0.2 | 0.3 | 1 | 5 |
| Si content in the film (atm %) | 0.5 | 1 | 2 | 4 | 8 | 14 |

The relationships of silicon content in the obtained film and Vickers hardness, adhesive strength and internal stress are shown in FIGS. 4 to 6, respectively.

A film containing no silicon was produced in the same manner as described above, but it was impossible to evaluate the properties of the film because it exfoliated from the substrate made of stainless steel.

EXAMPLE 21 TO 24

A diamond and/or diamond-like carbon layer 72 of 60 Å thickness was formed under the following conditions.

| Discharging time | 60 seconds |
|---|---|
| Flow rate of H₂ | 20 SCCM |
| Flow rate of CH₄ | 2 SCCM |
| RF power | 1 W/cm² |
| DC voltage | −300 V |
| Intensity of magnetic field | 700 gauss |

Discharge was stopped for a moment after the diamond and/or diamond-like carbon layer 72 was formed.

Next, a silicon carbide layer 73 of 20 Å thickness was formed under the following conditions.

| Discharging time | 15 seconds |
|---|---|
| Flow rate of H₂ | 200 SCCM |
| Flow rate of CH₄ | 1 SCCM |
| Flow rate of SiH₄ | 2 SCCM |
| RF power | 0.3 W/cm² |
| DC voltage | 0.3 W/cm² |
| Intensity of magnetic field | 700 gauss |

The above two kinds of discharging operation were repeated in order to make the polylayer film of Example 23 in Table 4. Other Examples in Table 4 were obtained by the same conditions as in Example 23 except discharging time was changed. Table 4 shows the composition of these Examples.

Table 5 shows the characteristics of the polylayer films of Examples 21 to 24 shown in Table 4.

TABLE 4

| | Substrate | Thickness of diamond and/or diamond-like carbon layer (A) | Thickness of silicon carbide layer (B) | Number of each layer |
|---|---|---|---|---|
| Ex. 21 | Single crystalline silicon | 500Å | 200Å | 60 |
| Ex. 22 | Single crystalline silicon | 100Å | 30Å | 300 |
| Ex. 23 | Single crystalline silicon | 60Å | 20Å | 500 |
| Ex. 24 | Aluminum | 500Å | 200Å | 60 |

TABLE 5

| | Ex. 21 | Ex. 22 | Ex. 23 | Ex. 24 |
|---|---|---|---|---|
| Heat conductivity at room temperature (W/m · k) | 100 to 120 | 100 to 120 | 110 to 120 | 150 to 200 |
| Electrical resistivity (Ω· cm) | >10¹⁴ | >10¹⁴ | >10¹⁴ | >10¹⁴ |
| Dielectric constant (1 MHz) | 12 to 15 | 12 to 15 | 12 to 15 | 12 to 15 |
| Dielectric loss (1 MHz) | <0.01 | <0.01 | <0.01 | <0.01 |
| Vickers hardness (kg/mm²) | 5000 to 6000 | 7000 to 8000 | 8000 to 9000 | 1000 to 5000 |
| Adhesive strength (kg/cm²) | >150 | >150 | >150 | >150 |
| Withstand voltage | >1 kV | >1 kV | >1 kV | >1 kV |

Figure 12:
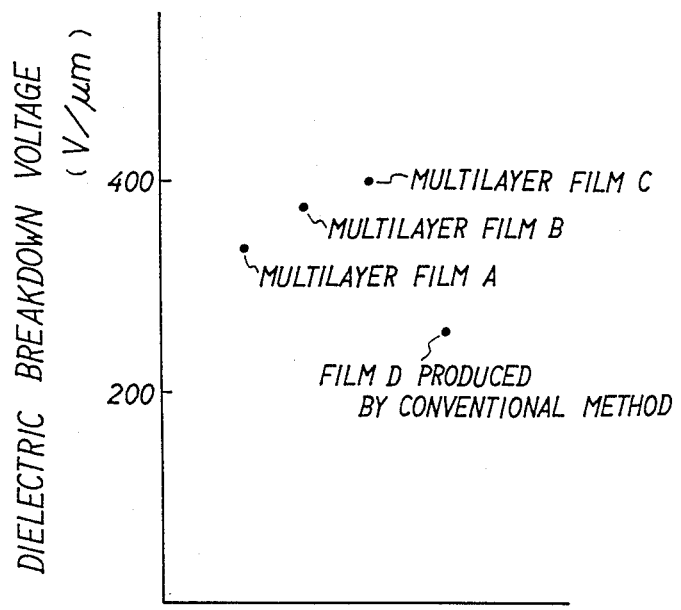
FIG. 12 is a view showing results of the measurement of the dielectric breakdown of samples A, B and C correponding to Examples 21, 22 and 23 respectively in Table 4, and of a film produced by a conventional method.

In FIG. 12 are shown the dielectric breakdown voltage of polylayer films A, B and C obtained by forming fifteen layers, seventy seven layers and one hundred and twenty five layers comprising diamond and/or diamond-like carbon under the same conditions as in Examples 21 to 23 respectively, and forming fifteen layers, seventy seven layers and one hundred and twenty five layers of silicon carbide.

The total thickness of these polylayer films A, B, and C was about 1 μm.

As an apparatus for making films, there can be employed not only a plasma CVD apparatus as shown in FIG. 8 comprising one reaction chamber, but also an apparatus wherein the substrate is movable, and diamond and/or diamond-like carbon films and silicon carbide films are formed in separate reaction chambers.

The dielectric breakdown voltage was measured by vacuum evaporating Al electrodes of 4 cm in diameter (i.e. 13 cm² in area) on each film and applying a voltage thereto.

As is clear from FIG. 12, each polylayer film (A, B and C) has sufficient insulation property, though the area thereof is large (i.e. 13 cm²).

In FIG. 12 is further shown the dielectric breakdown voltage of diamond and/or diamond-like carbon film D of 1 μm thickness produced by a conventional method.

The dielectric breakdown voltage can be increased by polylayer films, because the dielectric breakdown voltage is determined by the portion that has the poorest dielectric strength and therefore, in a conventional film, the dielectric strength is lowered due to the existence of a graphited portion though the amount thereof is very little.

EXAMPLE 25

A Cu substrate of 1 mm thickness was set on the side of a cathode of the apparatus as shown in FIG. 10. Amorphous silicon carbide of about 1 μm thickness was deposited by means of a mixed plasma CVD method of DC discharge and RF discharge, while introducing a mixed gas of $H_2$, $SiH_4$ and $CH_4$ from a gas inlet 4 under the following conditions.

| Reaction gas | $H_2$ 100 SCCM |
| --- | --- |
|  | $SiH_4$ 30 SCCM |
|  | $CH_4$ 30 SCCM |
| Pressure in the reaction chamber | 1.0 Torr |
| DC voltage | −600 V |
| DC current | 5 mA/cm² |
| RF power | 50 mW/cm² |

DC voltage was applied to electrodes 2, 22 by DC power 21 through a radio frequency choking coil 3.

The adhesive strength and surface Vickers hardness were 50 kg/cm² and 1500, respectively. Further, 18 atm % of hydrogen was contained in the film. The film has structural flexibility. Next, on the interlayer, is formed a silicon carbide layer as a thermally conductive insulating layer using an apparatus which is almost the same as the apparatus shown in FIG. 10, wherein a magnetic field was provided in a direction perpendicular to the electric field on the cathode whereon the substrate was set. Mixed discharge of DC discharge and RF discharge was employed. The production conditions were as follows:

| Reaction gas | $H_2$ 150 SCCM |
| --- | --- |
|  | $CH_4$ 20 SCCM |
|  | $SiH_4$ 30 SCCM |
| Pressure in the reaction chamber | 1.0 Torr |
| Intensity of magnetic field | 600 gausses |
| DC voltage | −400 V |
| DC current | 7 mA/cm² |
| RF power | 500 mW/cm² |
| Substrate temperature | 300° C. |

The deposition velocity was 5 Å/sec and the thickness of the layer was 5 μm.

As a result of X-ray diffraction analysis method, the film produced under the above-mentioned conditions was found to have a crystallization of the type of β-SiC.

The heat conductivity of the film was 0.70 cal/cm.sec.°C. around room temperature, and it did not lower (it was almost the same value as at room temperature) even when the temperature was raised up to around 100° C. The surface Vickers hardness was 3200, which value was almost equal to that of single crystalline β-SiC. Further, the electrical conductivity and withstand voltage were not more than $10^{-14}$ (Ω.cm)$^{-1}$ and not less than 1 kV, respectively. Exfoliation of the interlayer or silicon carbide layer from the Cu substrate was not at all observed after one thousand heat cycles wherein one cycle comprised keeping the substrate at −55° C. for 30 minutes and at 150° C. for 30 minutes. The adhesive strength was 50 kg/cm², which value was the same as that before the test. The exfoliation was generated between the interlayer and metal substrate, not between the interlayer and insulating layer. The insulated substrate was also suitable for a substrate for thin film circuit, since the surface roughness thereof (average roughness along center line) was not more than 0.1 μm.

EXAMPLE 26

A Mo layer 1000 Å thick was deposited on an Al substrate 1 mm thick by means of an EB vacuum evaporation plating method at room temperature. The deposition velocity was about 1 Å/sec.

Next, on the interlayer, is formed a silicon carbide layer as a thermally conductive insulating layer using an apparatus almost the same as shown in FIG. 10, wherein a magnetic field was provided in a direction perpendicular to the electric field on a cathode whereon the substrate was set. Mixed discharge of DC discharge and RF discharge was employed. The production conditions were as follows:

| Reaction gas | $H_2$ 150 SCCM |
| --- | --- |
|  | $CH_4$ 20 SCCM |
|  | $SiH_4$ 30 SCCM |
| Pressure in the reaction chamber | 1.5 Torr |
| Intensity of magnetic field | 500 gausses |
| DC voltage | −300 V |
| DC current | 7 mA/cm² |
| RF power | 500 mW/cm² |
| Substrate temperature | 200° C. |

The deposition velocity was 4 Å/sec and the thickness of the layer was 5 μm.

As a result of X-ray diffraction analysis method, the produced film was found to have a crystallization of the type of β-SiC. A very small amount of hydrogen was found to exist in the film, as a result of IR spectrum analysis (i.e. a small absorption was found in the stretching modes of C-H and Si-H).

The thermal conductivity of the film was 0.40 cal/cm.sec.°C. around room temperature, and it did not lower (it was almost the same value as at room temperature) even when the temperature was raised up to around 100° C. The surface Vickers hardness was 3200, which value was almost equal to that of single crystalline β-SiC. Further, the electrical conductivity and withstand voltage were not more than $10^{-14}$ $(\Omega\cdot cm)^{-1}$ and not less than 1 kV, respectively. Exfoliation of the interlayer or silicon carbide layer from the Cu substrate was not at all observed after one thousand heat cycles wherein one cycle comprises keeping a substrate at −55° C. for 30 minutes and at 150° C. for 30 minutes. The adhesive strength was 100 kg/cm², which value was the same as that before the test. The exfoliation was generated between the interlayer and metal substrate, not between the interlayer and insulating layer. The insulated substrate was also suitable for a substrate for thin film circuit, since the surface roughness thereof (average roughness along center line) was not more than 0.1 μm.

In the above Examples 25 and 26, amorphous silicon carbide and Mo were employed as an interlayer. However, almost the same results can be obtained when using such a metal as Pt, Ti, Cr, Ni or W as an interlayer.

EXAMPLE 27

A Mo layer 1000 Å thick was vacuum evaporated on a Cu substrate by means of an EB vacuum evaporation plating method. The substrate was set in the same apparatus as shown in FIG. 10. In that case, there was provided a magnetic field falling at right angles with the electric field on the substrate which was set on a cathode. A film was deposited on the substrate by means of a mixed discharge of DC discharge and RF discharge, while heating the substrate from the outside of a reaction chamber.

The production conditions were as follows:

| Reaction gas | CH₄ 2 SCCM |
| | H₂ 200 SCCM |
| Pressure in the reactive chamber | 5 Torr |
| Intensity of magnetic field | 600 gausses |
| DC voltage | −280 V |
| DC current | 10 mA/cm² |
| RF power | 200 mW/cm² |
| Substrate temperature | 400° C. |

The deposition velocity and thickness of the obtained film were 1 Å/sec and 5 μm, respectively.

The surface Vickers hardness of the obtained film was very large, i.e. 7500, which value was almost equal to that of natural diamond. In IR spectrum analysis, no hydrogen was observed. It was found by transmission electron diffraction (TED) that a ring corresponding to (111) and (220) of diamond was produced. The obtained film was a film comprising so-called diamond-like carbon.

The thermal conductivity of the film was 0.75 cal/cm.sec.°C. around room temperature, and it did not lower even when the temperature was raised up to around 100° C. The electrical conductivity and withstand voltage were about $10^{13}$ $(\Omega\cdot cm)^{-1}$ and 700 V, respectively. Exfoliation was not observed in the heat cycle test. The adhesive strength was 100 kg/cm², which value was the same as that before the test.

EXAMPLE 28

A Cu substrate, whereon an amorphous silicon carbide layer 5000 Å thick was formed as an interlayer like in Example 25, was set in the same apparatus as shown in FIG. 10. In that case, there was provided a magnetic field falling at right angles with the electric field on the substrate which was set on a cathode. A film 5 μm thick was formed by means of a mixed discharge of DC discharge and RF discharge under the following conditions, while heating the substrate from the outside of a reaction chamber.

| Reaction gas | CH₄ 3 SCCM |
| | CF₄ 1 SCCM |
| | H₂ 200 SCCM |
| Pressure in the reaction chamber | 7 Torr |
| Intensity of magnetic field | 700 gausses |
| DC voltage | −300 V |
| DC current | 15 mA/cm² |
| RF power | 250 mW/cm² |
| Deposition velocity | 3 Å/sec |
| Substrate temperature | 400° C. |

The surface Vickers hardness of the obtained film was very large, i.e. 8000, which value was almost equal to that of natural diamond. In IR spectrum analysis, no hydrogen was observed. It was found by transmission electron diffraction (TED) that a ring corresponding to (111) and (220) of diamond was produced. The obtained film was a film comprising so-called diamond-like carbon.

The heat conductivity of the film was 0.75 cal/cm-.sec.°C. around room temperature, and it did not lower even when the temperature was raised up to around 100° C. The electrical conductivity and withstand voltage were about $10^{14}$ $(\Omega\cdot cm)^{-1}$ and about not less than 1 kV, respectively. Exfoliation was not observed in the heat cycle test. The adhesive strength was 100 kg/cm², which value was the same as that before the test.

EXAMPLE 29

An Al substrate, whereon a Mo layer 1000 Å thick was formed as an interlayer like in Example 26, was set in the same apparatus as shown in FIG. 10. In that case, there was provided a magnetic field falling at right angles with the electric field on the substrate which was set on a cathode. A film 5 μm thick was formed by means of a mixed discharge of DC discharge and RF discharge, while heating the substrate from the outside of a reaction chamber under the following conditions.

| Reaction gas | CH₄ 2 SCCM |
| | H₂ 200 SCCM |
| Pressure in the reaction chamber | 5 Torr |
| Intensity of magnetic field | 700 gausses |
| DC voltage | −250 V |
| DC current | 10 mA/cm² |
| RF power | 200 mW/cm² |
| Deposition velocity | 1 Å/sec |
| Substrate temperature | 300° C. |

The surface Vickers hardness of the obtained film was very large, i.e. 7000. In IR spectrum analysis, no hydrogen was observed. It was found by transmission electron diffraction (TED) that a ring corresponding to (111) and (220) of diamond was produced. The obtained film was a film comprising so-called diamond-like carbon.

The thermal conductivity of the film was 0.45 cal/cm.sec.°C. around room temperature, and it did not lower even when the temperature was raised up to around 100° C. The electrical conductivity and withstand voltage were about $10^{13}\,(\Omega\cdot\text{cm})^{-1}$ and about 1 kV, respectively. Exfoliation was not observed in the heat cycle test. The adhesive strength was 100 kg/cm$^2$, which value was the same as that before the test.

What we claim is:

1. An insulated substrate having high thermal conductivity, comprising a metal substrate having a heat conductivity of not less than 50 W/m.k., and at least one insulating layer having a high thermal conductivity coated on the substrate, wherein said insulating layer has a thermal conductivity of not less than 50 W/m.k. and is selected from the group consisting of hard carbon material containing 0.01 to 20 atomic % of at least one element of group IVA deposited on the metal substrate by a plasma method or ion deposition method.

2. The insulated substrate of claim 1, wherein the metal substrate is selected form the group consisting of Cu, Cu alloy, Al, Al alloy, W, W alloy, Zn, Zn alloy, Ni and stainless steel.

3. The insulated metal substrate of claim 1, wherein the hard carbon material is selected from the group consisting of diamond and diamond-like carbon.

4. The insulated substrate of claim 3, wherein the diamond-like carbon contains not more than 9 atomic % of at least one element selected from the group consisting of Si and Ge.

5. The insulated substrate of any one of claims 3 and 4, wherein the thickness of the insulating layer is 10 Å to 2,000 Å.

6. The insulated substrate of any one of claims 1 to 3, wherein the insulating layer has an electrical resistivity of not less than $10^8$ $\Omega\cdot$cm and a thermal resistance of 20 V/$\mu$m.

7. The insulated substrate of any one of claims 1 to 3, wherein the heat conductivity of the insulated substrate is not less than 50 W/m.k.

8. The insulated substrate of any one of claims 1 to 3, wherein the heat conductivity of the insulated substrate is not less than 100 W/m.k.

9. The insulated substrate of any one of claims 1 to 3, wherein the surface Vickers hardness of the insulated substrate is not less than 500.

10. The insulated substrate of any one of claims 1 to 3, wherein the surface of Vickers hardness of the insulated substrate is not less than 1500.

11. The insulated substrate of claim 1, wherein the elements of group IV$_A$ is at least one element selected from the group consisting of Si, Ge and Sn.

12. An insulated substrate having high thermal conductivity, comprising a substrate having a thermal conductivity of not less than 50 W/m.k., and a multi-layer insulating film provided on the substrate, wherein said multi-layer insulating film has a thermal conductivity of not less than 50 W/m.k. and comprises a layer of at least one material selected from the group consisting of diamond and diamond-like carbon and a layer of silicon carbide.

13. The insulated substrate of claim 12, wherein the substrate comprises crystalline silicon.

14. The insulated substrate of claim 12, wherein the substrate comprises nitrated or oxidized crystalline silicon.

15. The insulated substrate of claim 12, wherein the substrate comprises metal.

16. The insulated substrate of claim 15, wherein the metal substrate is selected from the group consisting of Cu, Cu alloy, Al, Al alloy, W, W alloy, Zn, Zn alloy, Ni and stainless steel.

17. The insulated substrate of claim 12, wherein the diamond-like carbon contains not more than 9 atomic % of at least one element selected from the group consisting of Si and Ge.

18. The insulated substrate of claim 12, wherein the thickness of the layer of diamond or diamond-like carbon is 10 Å to 2,000 Å.

19. The insulated substrate of claim 12, wherein the thickness of the layer of silicon carbide is 10 Å to 1,000 Å and not less than two layers of silicon carbide are formed.

20. The insulated substrate of claim 12, wherein the insulating layer has an electrical resistivity of not less than $10^8$ $\Omega\cdot$cm and a thermal resistance of 20 V/$\mu$m.

21. The insulated substrate of claim 12, wherein the heat conductivity of the insulated substrate is not less than 50 W/m.k.

22. The insulated substrate of claim 12, wherein the heat conductivity of the insulated substrate is not less than 100 W/m.k.

23. The insulated substrate of claim 12, wherein the surface Vickers hardness of the insulated substrate is not less than 500.

24. The insulated substrate of claim 12, wherein the surface Vickers hardness of the insulated substrate is not less than 1500.

25. The insulated substrate of claim 12, wherein the dielectric constant and dielectric loss at 1 MHz of the insulated substrate are not more than 20 and not more than 0.02, respectively.

26. The insulated substrate of claim 14, wherein the nitrated or oxidized crystalline silicon substrate is obtained by making through holes in a crystalline silicon substrate and thereafter nitrating or oxidizing the substrate.

27. The insulated substrate of claim 14, wherein the nitration or oxidation takes place in the crystalline silicon substrate at least to a depth of 0.1 $\mu$m from the surface of the substrate.

28. The insulated substrate of claim 14, wherein the nitration or oxidation takes place in the crystalline silicon substrate at least to a depth of 0.5 $\mu$m from the surface of the substrate.

29. The insulated substrate of claim 14, wherein the thickness of the insulating layer is 0.5 to 10 $\mu$m.

30. The insulated substrate of claim 14, wherein the thickness of the insulated layer is 1 to 10 $\mu$m.

31. The insulated substrate of any one of claims 12, 51 and 52, wherein the electrical conductivity of the insulating layer is not more than $10^{-6}\,\Omega^{-1}\,\text{cm}^{-1}$.

32. The insulating substrate of claim 12, wherein the heat conductivity of the substrate is not less than 50 W/m.k. and the heat conductivity of the insulated substrate is not less than 45 W/m.k.

33. The insulated substrate of claim 12, wherein the electrical resistivity and dielectric breakdown voltage of the insulating layer are not less than $10^{12}$ $\Omega\cdot$cm and not less than 100 V/$\mu$m respectively.

34. The insulated substrate of claim 12, wherein the silicon carbide is single crystalline, polycrystalline, microcrystalline or amorphous, wherein said amorphous silicon carbide contains not more than 30 atomic % of at least one element selected from the group consisting of hydrogen and elements from the halogen group.

35. An insulated substrate having high thermal conductivity, comprising a substrate having a heat conductivity of not less than 50 W/m.k., and at least one insulating layer having a high thermal conductivity, wherein an interlayer comprising a metal or an amorphous material having a small coefficient of thermal expansion is provided on at least a portion of the substrate, and the insulating layer is provided on said interlayer, said insulating layer having a thermal conductivity of not less than 50 W/m.k. and being selected from the group consisting of (1) hard carbon material selected from the group consisting of diamond, diamond-like carbon, silicon carbide and germanium carbide; (2) silicon-containing non single crystalline material selected from the group consisting of silicon carbide, silicon nitride, silicon germanium, silicon germanium carbide, and silicon carbide oxide; (3) cubic BN; (4) hexagonal BN; (5) AlN; and (6) BP, wherein said hard carbon material contains 0.01 to 20 atomic % of at least one element of group IVA, and said non single crystalline silicon carbide contains not more than 30 atomic % of at least one element selected from the group consisting of hydrogen and elements of the halogen group.

36. The insulated substrate of claim 35, wherein the substrate comprises crystalline silicon.

37. The insulated substrate of claim 35, wherein the substrate comprises nitrated or oxidized crystalline silicon.

38. The insulated substrate of claim 35, wherein the substrate comprises metal.

39. The insulated substrate of claim 38, wherein the metal substrate is selected from the group consisting of Cu, Cu alloy, Al, Al alloy, W, W alloy, Zn, Zn alloy, Ni and stainless steel.

40. The insulated substrate of claim 35, wherein the diamond-like carbon contains not more than 9 atm % of at least one element selected from the group consisting of silicon and germanium.

41. The insulated substrate of claim 35, wherein the thickness of the insulating layer is 10 Å to 2,000 Å.

42. The insulated substrate of claim 35, wherein the insulating layer has an electrical resistivity of not less than $10^8$ .cm and a thermal resistance of 20 V/μm.

43. The insulated substrate of claim 35, wherein the heat conductivity of the insulated substrate is not less than 50 W/m.k.

44. The insulated substrate of claim 35, wherein the heat conductivity of the insulated substrate is not less than 100 W/m.k.

45. The insulated substrate of claim 35, wherein the surface Vickers hardness of the insulated substrate is not less than 500.

46. The insulated substrate of claim 35, wherein the surface Vickers hardness of the insulated substrate is not less than 1500.

47. The insulated substrate of claim 35, wherein the dielectric constant and dielectric loss at 1 MHz of the insulated substrate are not more than 20 and not more than 0.02, respectively.

48. The insulated substrate of claim 37, wherein the nitrated or oxidized crystalline silicon substrate is obtained by making through holes in a crystalline silicon substrate and thereafter nitrating or oxidizing the substrate.

49. The insulated substrate of claim 37, wherein the nitration or oxidation takes place in the crystalline silicon substrate at least to a depth of 0.1 μm from the surface of the substrate.

50. The insulated substrate of claim 37, wherein the nitration or oxidation takes place in the crystalline silicon substrate at least to a depth of 0.5 μm from the surface of the substrate.

51. The insulated substrate of claim 37, wherein the thickness of the insulating layer is 0.5 to 10 μm.

52. The insulated substrate of claim 37, wherein the thickness of the insulated layer is 1 to 10 μm.

53. The insulated substrate of claim 35, wherein the electrical conductivity of the insulating layer is not more than $10^{-6}\Omega^{-1}cm^{-1}$.

54. The insulated substrate of claim 35, wherein the element of group $IV_A$ is at least one element selected from the group consisting of Si, Ge and Sn.

55. The insulated substrate of claim 35, wherein a layer of hard carbon material having a thickness of 10 to 5,000 Å is formed on the interlayer, then a carbon film which substantially does not contain an element of group IVA is formed on the layer of hard carbon material.

56. The insulated substrate of claim 35, wherein the heat conductivity of the substrate is not less than 50 W/m.k. and the heat conductivity of the insulated substrate is not less than 45 W/m.k.

57. The insulated substrate of claim 35, wherein the electrical resistivity and dielectric breakdown voltage of the insulating layer are not less than $10^{12}$ Ω·cm and not less than 100 V/um respectively.

58. The insulated substrate of claim 35, wherein the interlayer comprises an amorphous silicon compound containing at least one member selected from the group consisting of a-Si, a-$Si_xC_{1-x}$, a-$Si_xN_{1-x}$, a-$Si_{x+y}C_{1-x}N_{1-y}$, a-$Si_{x+y}C_{1-x}O_{1-y}$, a-$Si_xGe_{1-x}$ and a-$Si_{x+y}C_{1-x}Ge_{1-y}$ (wherein x and y satisfy the relationships of $0.001 \leq x \leq 1$ and $0.001 \leq x+y \leq 1$).

59. The insulated substrate of claim 58, wherein the amorphous silicon compound contains (A) at least one member selected from the group consisting of a-Si, a-$Si_xC_{1-x}$, a-$Si_xN_{1-x}$, a-$Si_{x+y}C_{1-x}N_{1-y}$, a-$Si_{x+y}C_{1-x}O_{1-y}$, a-$Si_xGe_{1-x}$ and a-$Si_{x+y}C_{1-x}Ge_{1-y}$ (wherein x and y satisfy the relationships of $0.001 \leq x \leq 1$ and $0.001 \leq x+y \leq 1$), and (B) at least one element selected from the group consisting of hydrogen and elements of the halogen group.

60. The insulated substrate of claim 35, wherein the thickness of the interlayer is 100 Å to 5 μm.

61. The insulated substrate of claim 35, wherein the thickness of the insulated layer is 1000 Å to 200 μm.

* * * * *